(12) United States Patent
Han et al.

(10) Patent No.: US 11,393,834 B2
(45) Date of Patent: Jul. 19, 2022

(54) SEMICONDUCTOR STORAGE DEVICE

(71) Applicant: Kioxia Corporation, Tokyo (JP)

(72) Inventors: Yefei Han, Yokkaichi Mie (JP); Tetsu Morooka, Yokkaichi Mie (JP); Norio Ohtani, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 154 days.

(21) Appl. No.: 16/997,398

(22) Filed: Aug. 19, 2020

(65) Prior Publication Data

US 2021/0057425 A1 Feb. 25, 2021

(30) Foreign Application Priority Data

Aug. 21, 2019 (JP) .............................. JP2019-151439

(51) Int. Cl.
*H01L 21/00* (2006.01)
*H01L 27/11519* (2017.01)
*H01L 27/11524* (2017.01)
*H01L 21/28* (2006.01)
*H01L 29/423* (2006.01)
*H01L 27/11556* (2017.01)

(52) U.S. Cl.
CPC .. *H01L 27/11519* (2013.01); *H01L 27/11524* (2013.01); *H01L 27/11556* (2013.01); *H01L 29/40114* (2019.08); *H01L 29/42324* (2013.01)

(58) Field of Classification Search
CPC ......... H01L 27/11519; H01L 29/40114; H01L 27/11524; H01L 27/11556; H01L 29/42324
See application file for complete search history.

(56) References Cited

U.S. PATENT DOCUMENTS

| | | | |
|---|---|---|---|
| 10,672,785 B2 * | 6/2020 | Simsek-Ege | H01L 27/11582 |
| 10,700,090 B1 * | 6/2020 | Cui | H01L 27/1157 |
| 10,825,831 B1 * | 11/2020 | Koval | H01L 27/11556 |
| 2016/0336336 A1 | 11/2016 | Nagashima | |
| 2018/0269218 A1 * | 9/2018 | Kato | H01L 27/1157 |
| 2021/0296332 A1 * | 9/2021 | Han | H01L 24/46 |

* cited by examiner

*Primary Examiner* — Richard A Booth
(74) *Attorney, Agent, or Firm* — Foley & Lardner LLP

(57) ABSTRACT

According to one embodiment, a semiconductor storage device includes a first interconnection, a second interconnection, a first channel part, a second channel part, a first charge storage part, a second charge storage part, a first insulator, a second insulator, and a third insulator. The first insulator includes a portion between at least a portion of the first charge storage part and at least a portion of the second charge storage part, and extends in a first direction. The second insulator is between the first insulator and the first interconnection, and extends in the first direction at a position arranged with respect to the first charge storage part in the first direction. The third insulator is between the second interconnection and the first insulator, and extends in the first direction at a position arranged with respect to the second charge storage part in the first direction.

20 Claims, 20 Drawing Sheets

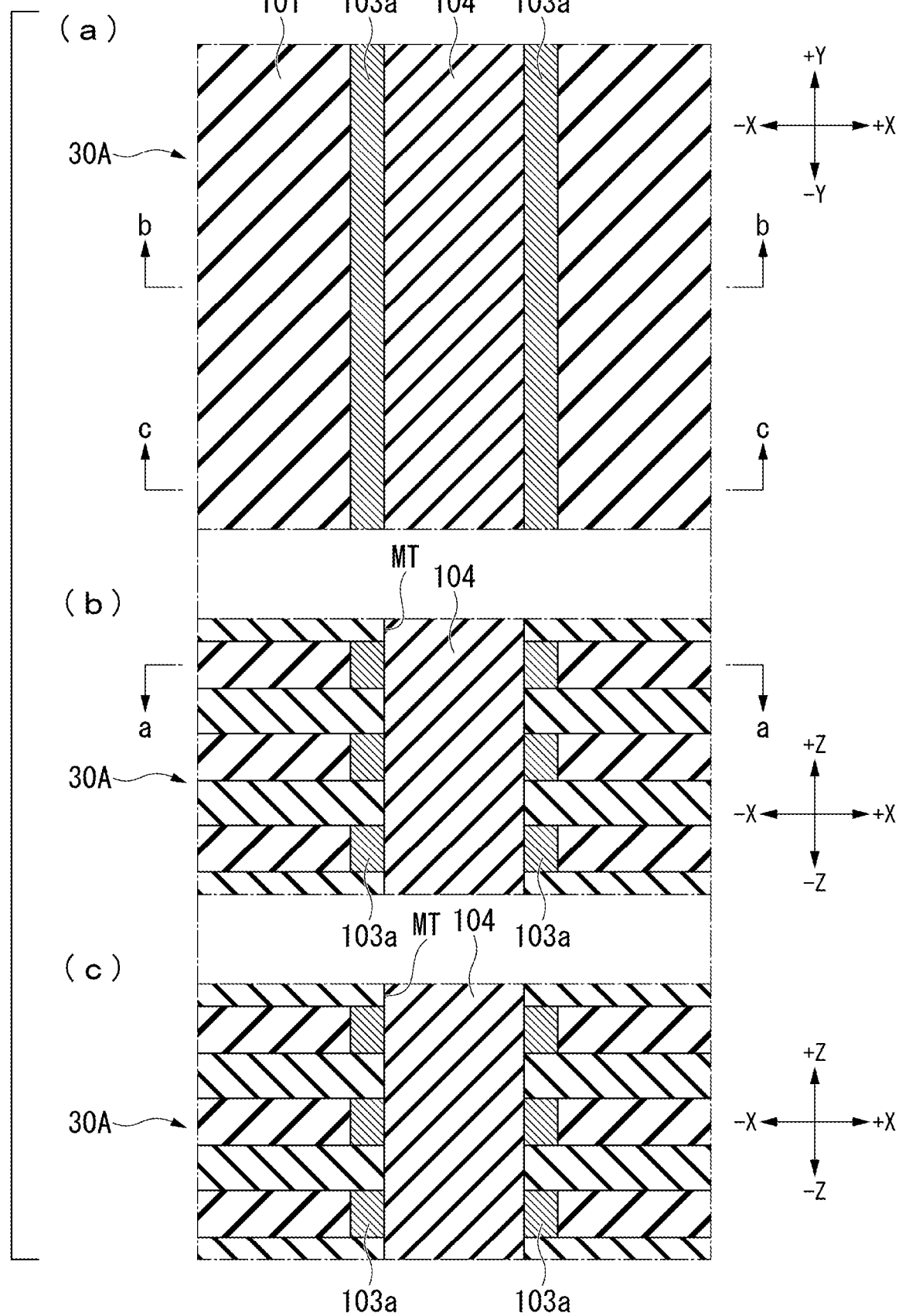

SEMICONDUCTOR STORAGE DEVICE

CROSS-REFERENCE TO RELATED APPLICATION

This application is based upon and claims the benefit of priority from Japanese Patent Application No. 2019-151439, filed Aug. 21, 2019; the entire contents of which are incorporated herein by reference.

FIELD

Embodiments described herein relate generally to a semiconductor storage device.

BACKGROUND

A semiconductor storage device including a laminated body in which insulating films and word lines are alternately laminated and semiconductor pillars passing through the laminated body is proposed. The semiconductor storage device may be expected to achieve further improvement in electrical characteristics.

BRIEF DESCRIPTION OF THE DRAWINGS

FIG. 2 is a cross-sectional view along line F2-F2 of a laminated body shown in

FIG. 1.

FIG. 3 is a cross-sectional view along line F3-F3 of a laminated body shown in

FIG. 2.

FIG. 5E is a cross-sectional view showing a part of the process of manufacturing the semiconductor storage device of the first embodiment.

DETAILED DESCRIPTION OF THE INVENTION

Figure 1:
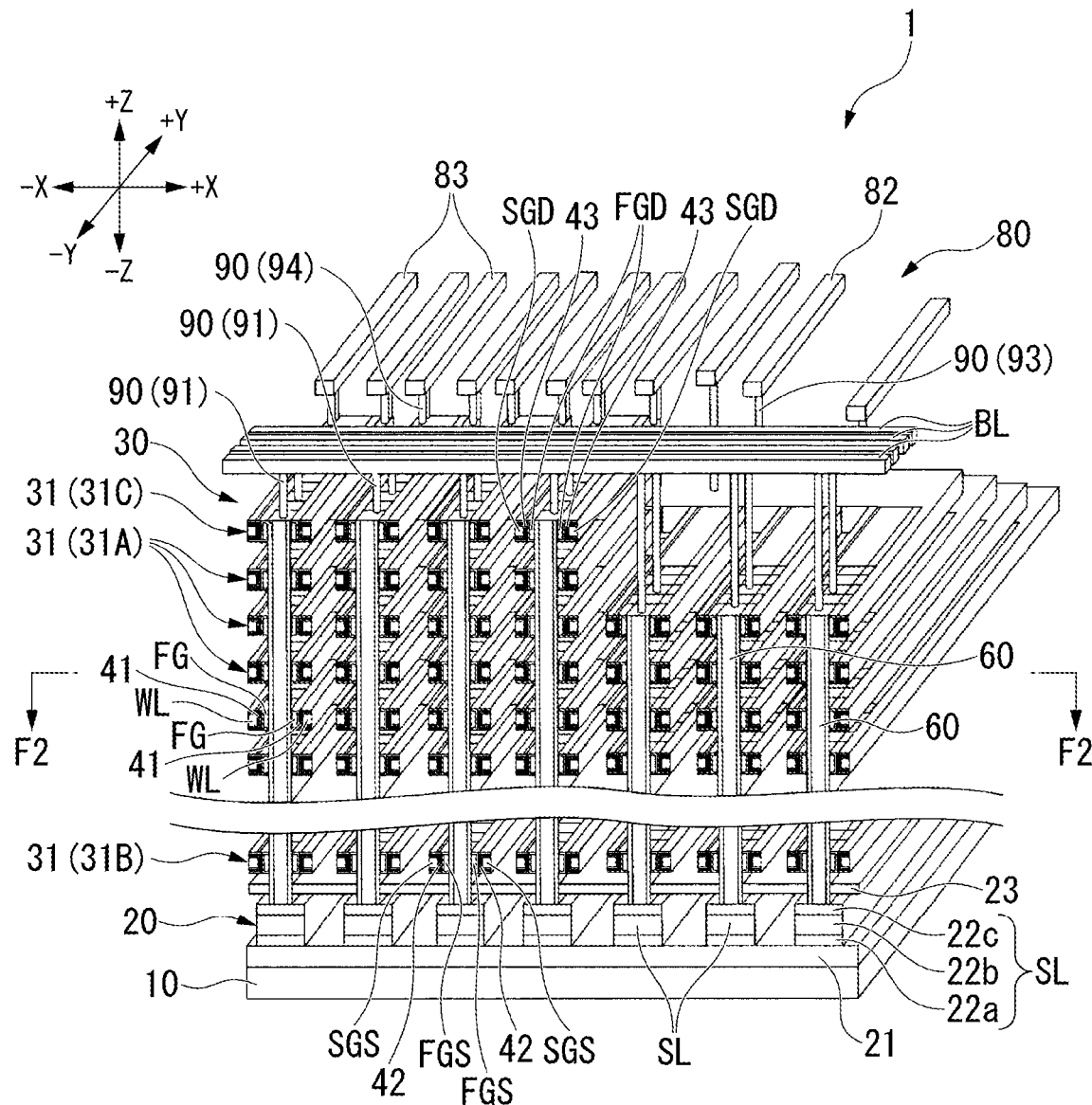
FIG. 1 is a perspective view showing a configuration of a semiconductor storage device of a first embodiment.

According to one embodiment, a semiconductor storage device includes a first interconnection, a second interconnection, a first channel part, a second channel part, a first charge storage part, a second charge storage part, a first insulator, a second insulator, and a third insulator. The first interconnection extends in a first direction. The second interconnection is adjacent to the first interconnection in a second direction intersecting the first direction. The second interconnection extends in the first direction. The first channel part is between the first interconnection and the second interconnection. The first channel part extends in a third direction intersecting the first direction and the second direction. The second channel part is between the first interconnection and the second interconnection. The second channel part is adjacent to the first channel part in the second direction. The second channel part extends in the third direction. The first charge storage part is between the first interconnection and the first channel part. The second charge storage part is between the second interconnection and the second channel part. The first insulator includes a portion between at least a portion of the first charge storage part and at least a portion of the second charge storage part. The first insulator extends in the first direction. The second insulator is between the first interconnection and the first insulator. The second insulator extends in the first direction at a position arranged with respect to the first charge storage part in the first direction. The third insulator is between the second interconnection and the first insulator. The third insulator extends in the first direction at a position arranged with respect to the second charge storage part in the first direction.

Hereinafter, semiconductor storage devices of embodiments will be described with reference to the accompanying drawings. In the following description, components having the same or similar functions are denoted by the same reference numerals and signs. The repeated description of these components may be omitted. In the present specification, the term "connection" is not limited to a case of physical connection, and also includes a case of electrical connection. In the present specification, any of the terms "adjacent", "overlap", and "face" is not limited to a case in which two elements adjoin and contact each other, and also includes a case where another element is interposed between the two elements. In the present specification, the wording "XX is provided above YY" is not limited to a case where XX is in contact with YY, and also includes a case where another member is interposed between XX and YY. In the present specification, the term "annular" is not limited to circular annular shapes, and also includes rectangular annular shapes. In the present specification, the term "arc shape" widely means a shape similar to an arc when seen in a broad perspective, and may include a portion having a different curvature halfway or on its end or a portion extending linearly. In the present specification, the terms "parallel" and "orthogonal" also include "substantially parallel" and "substantially orthogonal," respectively.

In addition, a +X direction, a −X direction, a +Y direction, a −Y direction, a +Z direction, and a −Z direction will be defined. The +X direction, the −X direction, the +Y direction, and the −Y direction are directions along a surface of a silicon substrate 10 to be described later. The +X direction is a direction in which bit lines BL to be described later extend. The −X direction is a direction opposite to the +X direction. In a case where the +X direction and the −X direction need not be distinguished from each other, these directions are simply referred to as the "X direction." The +Y direction and the −Y direction are directions intersecting (for example, orthogonal to) the X direction. The +Y direction is a direction in which word lines WL to be described later extend. The −Y direction is a direction opposite to the +Y direction. In a case where the +Y direction and the −Y direction need not be distinguished from each other, these directions are simply referred to as the "Y direction." The +Z direction and the −Z direction are directions intersecting (for example, orthogonal to) the X direction and the Y direction, and are the thickness directions of the silicon substrate 10. The +Z direction is a direction from the silicon substrate 10 toward a laminated body 30 to be described later. The −Z direction is a direction opposite to the +Z direction. In a case where the +Z direction and the −Z direction need not be distinguished from each other, these directions are simply referred to as the "Z direction." In the present specification, the "+Z direction" may be referred to as "above" or "upper," and the "−Z direction" may be referred to as "below" or "lower." However, these expressions are for convenience only, and do not specify the direction of gravity. The +Y direction is an example of a "first direction." The +X direction is an example of a "second direction." The +Z direction is an example of a "third direction."

First Embodiment

<1. Overall Configuration of Semiconductor Storage Device>

First, the overall configuration of a semiconductor storage device 1 of a first embodiment will be described. The semiconductor storage device 1 is a non-volatile semiconductor storage device, and is, for example, a NAND-type flash memory.

FIG. 1 is a perspective view showing a configuration of the semiconductor storage device 1. The semiconductor storage device 1 includes, for example, a silicon substrate 10, a lower structure 20, a laminated body 30, a plurality of pillars (columnar bodies) 60, an insulation separation part 70 (see FIG. 2), an upper structure 80, and a plurality of contacts 90. The pillars 60 are schematically shown in square column shapes in FIG. 1.

The silicon substrate 10 is a substrate serving as a base of the semiconductor storage device 1. At least a portion of the silicon substrate 10 is formed in a plate shape in the X direction and the Y direction. The silicon substrate 10 is formed of, for example, a semiconductor material including silicon (Si). The silicon substrate 10 is an example of a "substrate."

The lower structure 20 is above the silicon substrate 10. The lower structure 20 includes, for example, a lower insulating film 21, a plurality of source lines SL, and an upper insulating film 23. The lower insulating film 21 is above the silicon substrate 10. The plurality of source lines SL are above the lower insulating film 21. The plurality of source lines SL are adjacent to each other in the X direction, and extend in the Y direction. The source lines SL include, for example, a conductive layer 22a provided on the lower insulating film 21, an interconnect layer 22b provided on the conductive layer 22a, and a conductive layer 22c provided on the interconnect layer 22b. The upper insulating film 23 is above the plurality of source lines SL. An insulating member (not shown) is provided between the source lines SL and the upper insulating film 23, and is provided between the lower insulating film 21 and the upper insulating film 23.

The laminated body 30 is above the lower structure 20. The laminated body 30 includes, for example, a plurality of functional layers 31 and a plurality of insulating films (interlayer insulating films) 32 (see FIG. 3). The plurality of functional layers 31 and the plurality of insulating films 32 are alternately laminated one by one in the Z direction. The plurality of functional layers 31 include a plurality of first functional layers 31A, one or more second functional layers 31B, and one or more third functional layers 31C.

Each of the plurality of first functional layers 31A includes, for example, a plurality of word lines WL, a plurality of floating gate electrodes FG, and a plurality of block insulating films 41. The plurality of word lines WL are interconnections provided on the sides of the pillars 60. The plurality of word lines WL included in one first functional layer 31A are adjacent to each other in the X direction, and extend in the Y direction. A voltage is applied to the word line WL by a drive circuit (not shown) to apply a predetermined voltage to the floating gate electrode FG connected to the word line WL in a case where electrons are injected into the floating gate electrode FG to be described later, in a case where electrons injected in the floating gate electrode FG are drawn out from the floating gate electrode FG, or the like.

Each of the plurality of floating gate electrodes FG is an electrode film provided on the side of the pillar 60. The floating gate electrode FG is a film capable of storing charge. The floating gate electrode FG changes the storage state of electrons in a case where a voltage is applied through a word line WL. Each of the floating gate electrodes FG is provided between a word line WL to which a floating gate electrode FG corresponds and a pillar 60 to which the floating gate electrode FG corresponds. In the present specification, the term "correspond" is used to describe, for example, elements constituting one memory cell by mutual combination.

Each of the plurality of block insulating films 41 is provided between a word line WL to which a block insulating film 41 corresponds and a floating gate electrode FG to which the block insulating film 41 corresponds. The configuration of the first functional layer 31A will be described in detail later.

The second functional layer 31B is provided below the plurality of first functional layers 31A. The second functional layer 31B includes, for example, a plurality of source-side selection gate lines SGS, a plurality of source-side selection gate electrodes FGS, and a plurality of block insulating films 42. The plurality of source-side selection gate lines SGS are adjacent to each other in the X direction, and extend in the Y direction. Each of the plurality of source-side selection gate electrodes FGS is provided between a source-side selection gate line SGS to which a source-side selection gate electrode FGS corresponds and a pillar 60 to which the source-side selection gate electrode FGS corresponds. Each of the plurality of block insulating films 42 is provided between a source-side selection gate line SGS to which a block insulating film 42 corresponds and a source-side selection gate electrode FGS to which the block insulating film 42 corresponds. A voltage is applied to the source-side selection gate line SGS by the drive circuit (not shown) to apply a predetermined voltage to a source-side selection gate electrode FGS connected to the source-side selection gate line SGS in a case where the pillar 60 and the source line SL are caused to allow electrical conduction to each other.

The third functional layer 31C is provided above the plurality of first functional layers 31A. The third functional layer 31C includes, for example, a plurality of drain-side selection gate lines SGD, a plurality of drain-side selection gate electrodes FGD, and a plurality of block insulating films 43. The plurality of drain-side selection gate lines SGD are adjacent to each other in the X direction, and extend in the Y direction. Each of the plurality of drain-side selection gate electrodes FGD is provided between a word line WL to which a drain-side selection gate electrode FGD corresponds and a pillar 60 to which the drain-side selection gate electrode FGD corresponds. Each of the plurality of block insulating films 43 is provided between a drain-side selection gate line SGD to which a block insulating film 43 corresponds and a drain-side selection gate electrode FGD to which the block insulating film 43 corresponds. A voltage is applied to the drain-side selection gate line SGD by the drive circuit (not shown) to apply a predetermined voltage to a drain-side selection gate electrode FGD connected to the drain-side selection gate line SGD in a case where the pillar 60 and the source line SL are caused to allow electrical conduction to each other, and.

The plurality of pillars 60 are provided on the plurality of source lines SL, and extend in the Z direction. The plurality of pillars 60 are provided apart from each other in the X direction and the Y direction. For example, when seen in the Z direction, the plurality of pillars 60 are arranged in a matrix in the X direction and the Y direction. The lower end of each pillar 60 is connected to the source line SL through the upper insulating film 23 of the lower structure 20. The configuration of the pillar 60 and the configuration of the insulation separation part 70 will be described in detail later.

The upper structure 80 is above the laminated body 30. The upper structure 80 includes, for example, a plurality of bit lines BL, interconnections 81 (not shown) for the source-side selection gate lines SGS, interconnections 82 for the word lines WL, and interconnections 83 for the drain-side selection gate lines SGD.

Each of the plurality of contacts 90 extends in the Z direction. The plurality of contacts 90 include, for example, a plurality of contacts 91 for the pillars 60, a plurality of contacts 92 (not shown) for the source-side selection gate lines SGS, a plurality of contacts 93 for the word lines WL, and a plurality of contacts 94 for the drain-side selection gate lines SGD.

The contact 91 is provided on the pillar 60. A plurality of bit lines BL are adjacent to each other in the Y direction, and extend in the X direction. In a case where a pillar 60 provided on the farthest side in the −X direction among the plurality of pillars 60 arranged in the X direction is defined as a first one, odd-numbered pillars 60 are connected to a common bit line BL with the contacts 91 interposed therebetween. Even-numbered pillars 60 are connected to another common bit line BL with the contacts 91 interposed therebetween. That is, among the plurality of pillars 60 arranged in the X direction, pillars 60 adjacent to each other are not connected to the same bit line BL.

The plurality of contacts 92 (not shown) are provided on the ends of the source-side selection gate lines SGS in the +Y direction. The interconnection 81 (not shown) is provided on the contact 92, and extends in the Y direction. The interconnection 81 is connected to the source-side selection gate line SGS with the contact 92 interposed therebetween.

The plurality of contacts 93 are provided on the ends of the word lines WL in the Y direction. The interconnection 82 is provided on the contact 93, and extends in the Y direction. The interconnection 82 is connected to the word line WL with the contact 93 interposed therebetween.

The plurality of contacts 94 are provided on the ends of the drain-side selection gate lines SGD in the +Y direction. The interconnection 83 is provided on the contact 94, and extends in the Y direction. The interconnection 83 is connected to the drain-side selection gate line SGD with the contact 94 interposed therebetween.

<2. Structure of Laminated Body>

Next, the structure of the laminated body 30 will be described in detail.

Figure 2:
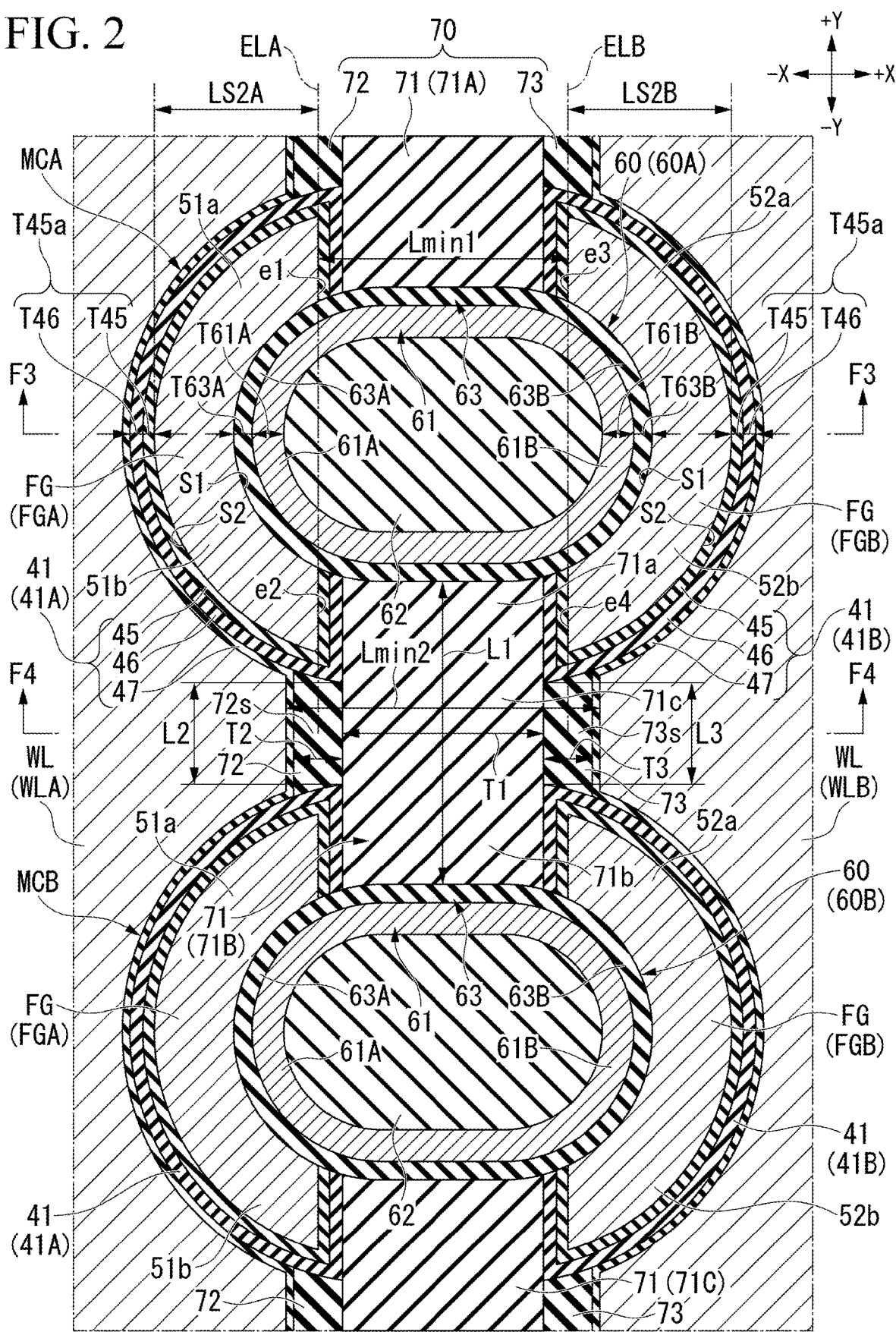
Figure 3:
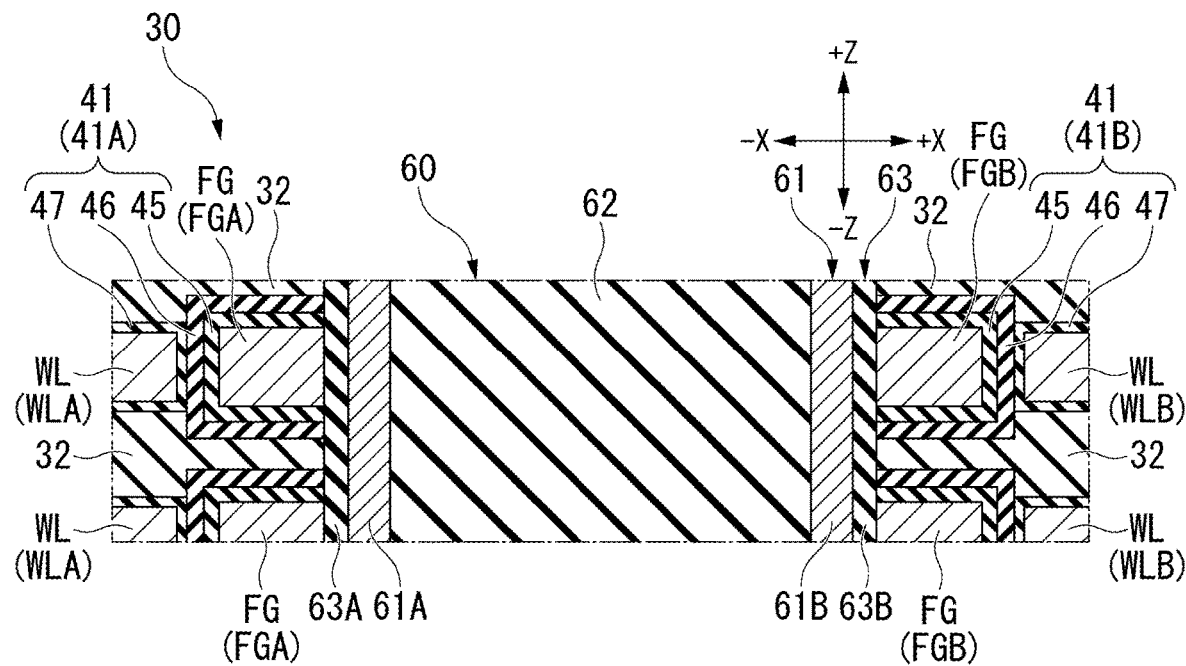
Figure 4:
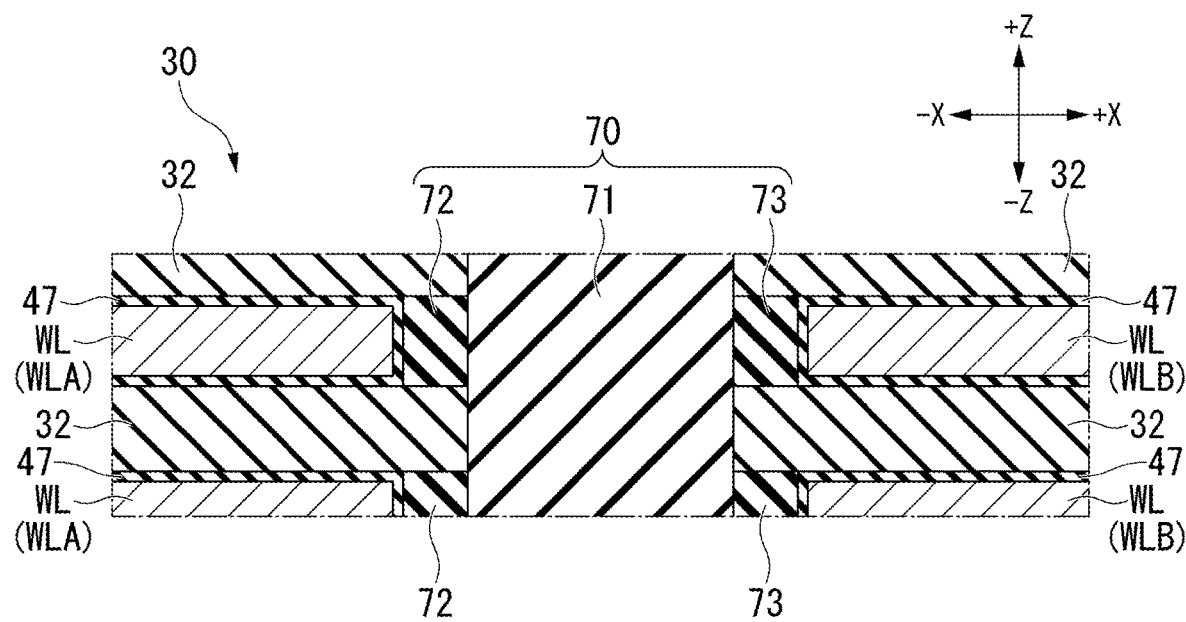
FIG. 4 is a cross-sectional view along line F4-F4 of the laminated body shown in FIG. 2.

FIG. 2 is a cross-sectional view along line F2-F2 of the laminated body 30 shown in FIG. 1. FIG. 3 is a cross-sectional view along line F3-F3 of the laminated body 30 shown in FIG. 2. FIG. 4 is a cross-sectional view along line F4-F4 of the laminated body 30 shown in FIG. 2.

The laminated body 30 has a storage structure capable of storing information in the vicinity of each pillar 60. The storage structures provided in the vicinity of the plurality of pillars 60 have the same structure. Therefore, hereinafter, focusing on two pillars 60 (a first pillar 60A and a second pillar 60B), a description will be made with a focus on structures in the vicinity of these pillars 60.

<2.1 Word Line>

First, the word line WL will be described. As shown in FIG. 2, the plurality of word lines WL include a first word line WLA located on a side in the −X direction and a second word line WLB located on a side in the +X direction with respect to each pillar 60. The first word line WLA and the second word line WLB are adjacent to each other in the X direction, and extend in the Y direction. The first word line WLA and the second word line WLB are extracted in opposite directions, for example, in the Y direction, and are controlled independently of each other. The first word line WLA is an example of a "first interconnection." The second word line WLB is an example of a "second interconnection."

The word line WL is formed of, for example, tungsten. A barrier metal film (not shown) for suppressing the diffusion of a material of the word line WL may be provided on the surface of the word line WL. The barrier metal film is formed of, for example, titanium nitride (TiN).

<2.2 Floating Gate Electrode>

Next, the floating gate electrode FG will be described. As shown in FIG. 2, a plurality of floating gate electrodes FG include a first floating gate electrode FGA located on a side in the −X direction and a second floating gate electrode FGB located on a side in the +X direction with respect to each pillar 60. The first floating gate electrode FGA is provided between the first word line WLA and the pillar 60 (more specifically, between the first word line WLA and a first channel part 61A of the pillar 60 to be described later). On the other hand, the second floating gate electrode FGB is provided between the second word line WLB and the pillar 60 (more specifically, between the second word line WLB and a second channel part 61B of the pillar 60 to be described later). The first floating gate electrode FGA is an example of a "first charge storage part." The second floating gate electrode FGB is an example of a "second charge storage part."

The floating gate electrode FG is formed of, for example, polysilicon. The first floating gate electrode FGA changes the storage state of electrons in a case where a voltage is applied through the first word line WLA. The second floating gate electrode FGB changes the storage state of electrons in a case where a voltage is applied through the second word line WLB.

As shown in FIG. 2, the first floating gate electrode FGA includes, for example, a first portion (a first curved part) 51a and a second portion (a second curved part) 51b. The first portion Ma is located on a side in the +Y direction (a first side) compared to a central portion of the first floating gate electrode FGA in the Y direction. The first portion 51a protrudes to a side in the +Y direction compared to an end (an edge) of a channel 61 to be described later in the +Y direction. On the other hand, the second portion 51b is located on a side in the −Y direction (a second side) from the central portion of the first floating gate electrode FGA in the Y direction. The second portion 51b protrudes to a side in the −Y direction compared to an end (an edge) of the channel 61 in the −Y direction.

In the present embodiment, the first floating gate electrode FGA is formed, for example, in an arc shape having a central angle of substantially 180°. In the present embodiment, the first portion 51a is formed in an arc shape in which the first portion 51a comes closer to a first insulator 71 to be described later as being separated in the +Y direction from the central portion of the first floating gate electrode FGA in the Y direction. The first portion 51a includes a portion located on a side in the +X direction compared to an edge of the channel 61 in the −X direction. The first portion 51a has a first end e1 adjacent to the first insulator 71 (an insulating part 71A to be described later) in the X direction. The wording "adjacent to the first insulator" means closest to the first insulator 71 in the first portion 51a. This definition also applies to the second portion 51b of the first floating gate electrode FGA and the second floating gate electrode FGB.

On the other hand, the second portion 51b is formed in an arc shape in which the second portion 51b comes closer to the first insulator 71 as being separated in the −Y direction from the central portion of the first floating gate electrode FGA in the Y direction. The second portion 51b includes a portion located on a side in the +X direction compared to an end (an edge) of the channel 61 in the −X direction. The second portion 51b has a second end e2 adjacent to the first insulator 71 (an insulating part 71B to be described later) in the X direction. The first portion 51a and the second portion 51b may be connected directly to each other, or may be provided with a linear portion extending in the Y direction between the first portion 51a and the second portion 51b.

Similarly, the second floating gate electrode FGB includes, for example, a first portion (a first curved part) 52a and a second portion (a second curved part) 52b. The first portion 52a is located on a side in the +Y direction (a first side) compared to a central portion of the second floating gate electrode FGB in the Y direction. The first portion 52a protrudes to a side in the +Y direction compared to the end of the channel 61 in the +Y direction. On the other hand, the second portion 52b is located on a side in the −Y direction (a second side) compared to the central portion of the first floating gate electrode FGA in the Y direction. The second portion 52b protrudes to a side in the −Y direction compared to the end of the channel 61 in the −Y direction.

In the present embodiment, the second floating gate electrode FGB is formed, for example, in an arc shape having a central angle of substantially 180°. In the present embodiment, the first portion 52a is formed in an arc shape in which the first portion 52a comes closer to the first insulator 71 to be described later as being separated in the +Y direction from the central portion of the second floating gate electrode FGB in the Y direction. The first portion 52a includes a portion located on a side in the −X direction compared to the end of the channel 61 in the +X direction. The first portion 52a has a first end e3 adjacent to the first insulator 71 (the insulating part 71A to be described later) in the X direction.

On the other hand, the second portion 52b is formed in an arc shape in which the second portion 52b comes closer to the first insulator 71 as being separated in the −Y direction from the central portion of the second floating gate electrode FGB in the Y direction. The second portion 52b includes a portion located on a side in the −X direction from the end of the channel 61 in the +X direction. The second portion 52b has a second end e4e adjacent to the first insulator 71 (the insulating part 71B to be described later) in the X direction. The first portion 52a and the second portion 52b may be connected directly to each other, or may be provided with a linear portion extending in the Y direction between the first portion 52a and the second portion 52b.

<2.3 Block Insulating Film>

Next, the block insulating film 41 will be described. As shown in FIG. 2, a plurality of block insulating films 41 include a first block insulating film 41A located on a side in the −X direction and a second block insulating film 41B located on a side in the +X direction with respect to each pillar 60. The first block insulating film 41A is provided between the first word line WLA and the first floating gate electrode FGA. The second block insulating film 41B is provided between the second word line WLB and the second floating gate electrode FGB. In the present embodiment, a portion of the first block insulating film 41A is provided between the first floating gate electrode FGA and a second insulator 72 to be described later in the Y direction. A portion of the second block insulating film 41B is provided between the second floating gate electrode FGB and a third insulator 73 to be described later in the Y direction.

Each of the first and second block insulating films 41A and 41B is formed of, for example, three insulating films 45, 46, and 47.

The insulating film 45 is located closest to the floating gate electrode FG among the three insulating films 45, 46, and 47. The insulating film 45 covers, for example, the lateral side, the upper surface, and the lower surface of the floating gate electrode FG (see FIG. 3). The insulating film 45 is formed of, for example, silicon oxide ($SiO_2$). However, the insulating film 45 may be formed of a high-k material such as silicon nitride (SiN) or hafnium oxide (HfO), or may be formed of materials including ruthenium (Ru), aluminum (Al), titanium (Ti), zirconium (Zr), or silicon (Si). The insulating film 45 is an example of a "first insulating film."

The insulating film 46 is provided on the opposite side of the floating gate electrode FG with respect to the insulating film 45. The insulating film 46 covers the lateral side, the upper surface, and the lower surface of the floating gate electrode FG, for example, with the insulating film 45 interposed therebetween (see FIG. 3). However, the insulating film 46 may cover only the lateral side of the floating gate electrode FG instead of the above configuration, and be provided along a boundary between the insulating film (interlayer insulating film) 32 and the word line WL. The insulating film 46 is formed of, for example, silicon oxide or silicon nitride. The insulating film 46 is another example of the "first insulating film."

The insulating film 47 is provided on the opposite side of the floating gate electrode FG with respect to the insulating films 45 and 46. The insulating film 47 is provided along, for example, a boundary between the insulating film (interlayer insulating film) 32 and the word line WL, and covers the lateral side of the floating gate electrode FG with the insulating films 45 and 46 interposed therebetween (see FIG. 3). However, instead of the above configuration, the insulating film 47 may cover the lateral side, the upper surface, and the lower surface of the floating gate electrode FG similarly to the insulating films 45 and 46. The insulating film 47 may be formed of a material having a high dielectric constant, and is formed of, for example, a high-k film of an oxide film containing aluminum (Al), hafnium (Hf), or zirconium (Zr). The insulating film 47 may be formed of silicon nitride.

<2.4 Pillar>

Next, the pillar 60 will be described. As shown in FIG. 2, the pillar 60 is provided between the first word line WLA and the second word line WLB. The pillar 60 includes, for example, the channel 61, a core insulating part 62, and a tunnel insulating film 63.

The channel 61 extends in the Z direction throughout the total length (total height) of the pillar 60 in the Z direction. The lower end of the channel 61 passes through the upper insulating film 23 of the lower structure 20, and is connected to the source line SL. On the other hand, the upper end of the channel 61 is connected to the bit line BL with the contact 91 interposed therebetween. The channel 61 is formed of a semiconductor material such as amorphous silicon (a-Si). However, a portion of the channel 61 may be formed of, for example, polysilicon doped with an impurity. The impurity contained in the channel 61 is, for example, any one selected from the group consisting of carbon, phosphorus, boron, and germanium. In the channel 61, a current flows between the source line SL and the bit line BL, for example, in a case where electrons are injected into the floating gate electrode FG, a case where the electrons injected in the floating gate electrode FG are drawn out from the floating gate electrode FG, or the like.

In the present embodiment, the channel 61 is formed in an annular shape (for example, in a circular annular shape of a long hole having a longitudinal side in the X direction) between the first word line WLA and the second word line WLB. The channel 61 includes the first channel part 61A located on a side in the −X direction in the pillar 60 and the second channel part 61B located on a side in the +X direction in the pillar 60. The first and second channel parts 61A and 61B are adjacent to each other in the X direction, and extend in the Z direction.

The core insulating part 62 is provided on the central side of the pillar 60 compared to the channel 61 in the X direction and the Y direction. For example, the core insulating part 62 is provided on the inner circumferential surface of the channel 61. The core insulating part 62 extends in the Z direction throughout the total length (total height) of the pillar 60 in the Z direction. The core insulating part 62 is formed of, for example, silicon oxide (SiO).

The tunnel insulating film 63 is provided along at least the lateral side of the channel 61 in the −X direction and the lateral side thereof in the +X direction. The tunnel insulating film 63 includes a first tunnel insulating film 63A located on a side in the −X direction in the pillar 60 and a second tunnel insulating film 63B located on a side in the +X direction in the pillar 60. The first tunnel insulating film 63A is provided between the first floating gate electrode FGA and the first channel part 61A. The first tunnel insulating film 63A is an example of a "second insulating film." The second tunnel insulating film 63B is provided between the second floating gate electrode FGB and the second channel part 61B.

In the present embodiment, the tunnel insulating film 63 is formed in an annular shape (for example, in a circular annular shape of a long hole having a longitudinal side in the X direction) surrounding the lateral side of the channel 61 in the −X direction, the lateral side thereof in the +X direction, the lateral side thereof in the −Y direction, and the lateral side thereof in the +Y direction. The tunnel insulating film 63 extends, for example, in the Z direction throughout the total length (total height) of the pillar 60 in the Z direction.

As shown in FIG. 2, with the configuration described above, a first cell structure MCA capable of holding charge in the vicinity of the first pillar 60A is formed by the first and second floating gate electrodes FGA and FGB, the first and second block insulating films 41A and 41B, and the first and second tunnel insulating films 63A and 63B which correspond to the first pillar 60A. Similarly, a second cell structure MCB capable of holding charge in the vicinity of the second pillar 60B is formed by the first and second floating gate electrodes FGA and FGB, the first and second block insulating films 41A and 41B, and the first and second tunnel insulating films 63A and 63B which correspond to the second pillar 60B. The second cell structure MCB is adjacent to the first cell structure MCA in the −Y direction.

In one viewpoint, the floating gate electrodes FGA and FGB corresponding to the second pillar 60B are an example of a "third charge storage part" and a "fourth charge storage part," respectively. The block insulating films 41A and 41B corresponding to the second pillar 60B are an example of a "third block insulating film" and a "fourth block insulating film," respectively. The tunnel insulating films 63A and 63B corresponding to the second pillar 60B are an example of a "third tunnel insulating film" and a "fourth tunnel insulating film," respectively.

<2.5 Insulation Separator>

Next, the insulation separator 70 will be described.

As shown in FIG. 2, the insulation separator 70 is provided in the laminated body 30, and separates the first word line WLA and the second word line WLB each other. The insulation separator 70 includes, for example, a first insulator 71, a second insulator 72, and a third insulator 73.

<2.5.1 First Insulator>

First, the first insulator 71 will be described. As shown in FIG. 2, the first insulator 71 is provided between the plurality of pillars 60 in the Y direction, and extends in the Y direction between the plurality of pillars 60. The first insulator 71 is provided between the first word line WLA and the second word line WLB in the X direction so as to separate the first word line WLA and the second word line WLB each other. In addition, the first insulator 71 is provided between a portion of the first floating gate electrode FGA and a portion of the second floating gate electrode FGB in the X direction so as to separate the first floating gate electrode FGA and the second floating gate electrode FGB each other.

Specifically, the first insulator 71 includes, for example, a first portion 71a, a second portion 71b, and a third portion 71c. The first portion 71a is provided between the second portion 51b of the first floating gate electrode FGA of the first cell structure MCA and the second portion 52b of the second floating gate electrode FGB of the first cell structure MCA in the X direction. The second portion 71b is provided between the first portion 51a of the first floating gate electrode FGA of the second cell structure MCB and the first portion 52a of the second floating gate electrode FGB of the second cell structure MCB in the X direction. The third portion 71c extends between the first portion 71a and the second portion 71b in the Y direction, and connects the first portion 71a and the second portion 71b. The first insulator 71 electrically insulates the first floating gate electrode FGA from the second floating gate electrode FGB in cooperation with the pillar 60. The first insulator 71 extends, in the Z direction, throughout the total length (total height) of the pillar 60 in the Z direction (see FIG. 4).

As shown in FIG. 2, the pillar 60 and the first insulator 71 are provided alternately in the Y direction. In other words, the first insulator 71 is separately provided on both sides of the pillar 60 in the Y direction. For example, the first insulator 71 includes an insulating part 71A, an insulating part 71B, and an insulating part 71C.

The insulating part 71A is provided between a portion of the first floating gate electrode FGA and a portion of the second floating gate electrode FGB in the first cell structure MCA, and extends in the Y direction. The insulating part 71B is located on the opposite side of the insulating part 71A with respect to the first pillar 60A in the Y direction. The insulating part 71B is provided between another portion of the first floating gate electrode FGA and another portion of the second floating gate electrode FGB in the first cell structure MCA, and extends in the Y direction. In one viewpoint, the insulating part 71A is an example of the "first insulator," and the insulating part 71B is an example of a "fourth insulator."

The insulating part 71B is provided between a portion of the first floating gate electrode FGA and a portion of the second floating gate electrode FGB in the second cell structure MCB, and extends in the Y direction. The insulating part 71C is located on the opposite side of the insulating part 71B with respect to the second pillar 60B in the Y direction. The insulating part 71C is provided between another portion of the first floating gate electrode FGA and another portion of the second floating gate electrode FGB in the second cell structure MCB, and extends in the Y direction.

Thereby, the first insulator 71 electrically insulates the first word line WLA from the second word line WLB in cooperation with the pillar 60. In the present embodiment, the first insulator 71 extends linearly in the Y direction between the tunnel insulating film 63 of the first cell structure MCA and the tunnel insulating film 63 of the second cell structure MCB, and is in contact with the tunnel insulating film 63 of the first cell structure MCA and the tunnel insulating film 63 of the second cell structure MCB. In the present embodiment, a length L1 of a shortest portion of the first insulator 71 in the Y direction is larger than a minimum thickness T1 of the first insulator 71 in the X direction. The first insulator 71 is formed of, for example, an insulating material such as silicon oxide ($SiO_2$).

<2.5.2 Second Insulator>

Next, the second insulator 72 will be described. As shown in FIG. 2, the second insulator 72 is provided in the −X direction with respect to the first insulator 71. The second insulator 72 is provided between the first word line WLA and the first insulator 71 in the X direction.

The second insulator 72 is not present in a region overlapping the first channel part 61A of the first cell structure MCA in the X direction and a region overlapping the first channel part 61A of the second cell structure MCB in the X direction. The second insulator 72 is provided on both sides of each of the first floating gate electrodes FGA in the Y direction. In other words, a cell structure such as the first cell structure MCA or the second cell structure MCB, and the second insulator 72 are provided alternately in the Y direction.

As shown in FIG. 2, the second insulator 72 is provided at a position adjacent to the first floating gate electrode FGA and the insulating films 45 and 46 of the first block insulating film 41A in the Y direction, and extends linearly in the Y direction. That is, the second insulator 72 extends in parallel with the first insulator 71. The second insulator 72 is provided between the first floating gate electrode FGA of the first cell structure MCA and the first floating gate electrode FGA of the second cell structure MCB in the Y direction. From another viewpoint, the second insulator 72 is provided between the first block insulating film 41A of the first cell structure MCA and the first block insulating film 41A of the second cell structure MCB in the Y direction. The second insulator 72 is in contact with the first block insulating film 41A of the first cell structure MCA and the first block insulating film 41A of the second cell structure MCB.

A length L2 of a shortest portion of the second insulator 72 in the Y direction (that is, the shortest length of the second insulator 72 in the Y direction) is larger than the minimum thickness T2 of the second insulator 72 in the X direction. In another viewpoint, the length of a longest portion of the second insulator 72 in the Y direction (that is, the longest length of the second insulator 72 in the Y direction) is larger than the maximum thickness of the second insulator 72 in the X direction.

In the present embodiment, the second insulator 72 includes a portion 72s which is not arranged with respect to the first block insulating film 41A in the X direction. The minimum thickness T2 (or the maximum thickness) of the portion 72s of the second insulator 72 in the X direction is larger than the minimum thickness T61A of the first channel part 61A in the X direction. The minimum thickness T2 (or the maximum thickness) of the portion 72s of the second insulator 72 in the X direction is larger than the minimum thickness T63A of the first tunnel insulating film 63A in the X direction. The minimum thickness T2 (or the maximum thickness) of the portion 72s of the second insulator 72 in the X direction is larger than the minimum thickness T45 of the insulating film 45 included in the first block insulating film 41A in the X direction. The minimum thickness T2 (or the maximum thickness) of the portion 72s of the second insulator 72 in the X direction is larger than the minimum thickness T46 of the insulating film 46 included in the first block insulating film 41A in the X direction. In the present embodiment, the minimum thickness T2 (or the maximum thickness) of the portion 72s of the second insulator 72 in the X direction is larger than the minimum thickness T45a of a total of the insulating film 45 and the insulating film 46 included in the first block insulating film 41A in the X direction.

As shown in FIG. 2, the first floating gate electrode FGA has an inner surface (a first surface) S1 adjacent to the first channel part 61A and an outer surface (second surface) S2 located on the opposite side of the inner surface S1. In a case where a virtual line ELA that connects the first end e1 and the second end e2 of the first floating gate electrode FGA is drawn, the maximum thickness of the second insulator 72 in the X direction is smaller than the maximum distance LS2A between the virtual line ELA and the outer surface S2 of the first floating gate electrode FGA.

As shown in FIG. 4, the second insulator 72 is provided between the plurality of insulating films (interlayer insulating films) 32 in the Z direction.

<2.5.3 Third Insulator>

Next, the third insulator 73 will be described. As shown in FIG. 2, the third insulator 73 is provided in the +X direction with respect to the first insulator 71. The third insulator 73 is provided between the second word line WLB and the first insulator 71 in the X direction.

The third insulator 73 is not present in a region overlapping the second channel part 61B of the first cell structure MCA in the X direction and a region overlapping the second channel part 61B of the second cell structure MCB in the X direction. The second insulator 72 is provided on both sides of each of the second floating gate electrodes FGB in the Y direction. In other words, that is, a cell structure such as the first cell structure MCA or the second cell structure MCB, and the third insulator 73 are provided alternately in the Y direction.

As shown in FIG. 2, the third insulator 73 is provided at a position adjacent to the second floating gate electrode FGB and the insulating films 45 and 46 of the second block insulating film 41B in the Y direction, and extends linearly in the Y direction. That is, the third insulator 73 extends in parallel with the first insulator 71. The third insulator 73 is provided between the second floating gate electrode FGB of the first cell structure MCA and the second floating gate electrode FGB of the second cell structure MCB in the Y direction. From another viewpoint, the second insulator 72 is provided between the second block insulating film 41B of the first cell structure MCA and the second block insulating film 41B of the second cell structure MCB in the Y direction. The third insulator 73 is in contact with the second block insulating film 41B of the first cell structure MCA and the second block insulating film 41B of the second cell structure MCB.

A length L3 of a shortest portion of the third insulator 73 in the Y direction (that is, the shortest length of the third insulator 73 in the Y direction) is larger than the minimum thickness T3 of the third insulator 73 in the X direction. In another viewpoint, the length of a longest portion of the third insulator 73 in the Y direction (that is, the longest length of the third insulator 73 in the Y direction) is larger than the maximum thickness of the third insulator 73 in the X direction.

In the present embodiment, the third insulator 73 includes a portion 73s which is not arranged with respect to the second block insulating film 41B in the X direction. The minimum thickness T3 (or the maximum thickness) of the portion 73s of the third insulator 73 in the X direction is larger than the minimum thickness T61B of the second channel part 61B in the X direction. The minimum thickness T3 (or the maximum thickness) of the portion 73s of the third insulator 73 in the X direction is larger than the minimum thickness T63B of the second tunnel insulating film 63B in the X direction. The minimum thickness T3 (or the maximum thickness) of the portion 73s of the third insulator 73 in the X direction is larger than the minimum thickness T45 of the insulating film 45 included in the second block insulating film 41B in the X direction. The minimum thickness T3 (or the maximum thickness) of the portion 73s of the third insulator 73 in the X direction is larger than the minimum thickness T46 of the insulating film 46 included in the second block insulating film 41B in the X direction. In the present embodiment, the minimum thickness T3 (or the maximum thickness) of the portion 73s of the third insulator 73 in the X direction is larger than the minimum thickness T45a of a total of the insulating film 45 and the insulating film 46 included in the second block insulating film 41B in the X direction.

As shown in FIG. 2, the second floating gate electrode FGB has an inner surface (a first surface) S1 adjacent to the second channel part 61B and an outer surface (a second surface) S2 located on the opposite side of the inner surface S1. In a case where a virtual line ELB that connects the first end e3 and the second end e4 of the second floating gate electrode FGB is drawn, the maximum thickness of the third insulator 73 in the X direction is smaller than the maximum distance LS2B between the virtual line ELB and the outer surface S2 of the second floating gate electrode FGB.

As shown in FIG. 4, the third insulator 73 is provided between the plurality of insulating films (interlayer insulating films) 32 in the Z direction.

In the present embodiment, a material constituting the second insulator 72 and the third insulator 73 is the same as a material constituting the first insulator 71. For example, the second insulator 72 and the third insulator 73 are formed of an insulating material such as silicon oxide ($SiO_2$). Meanwhile, a material constituting the second insulator 72 and the third insulator 73 may be different from a material constituting the first insulator 71. For example, the second insulator 72 and the third insulator 73 may be formed of an insulating material such as silicon nitride (SiN), or may be a hollow (an air gap) filled with gas (for example, air), or the like. The material of the second insulator 72 and the third insulator 73 is not particularly limited, and may be a material having a lower dielectric constant than a material constituting the first word line WLA and the second word line WLB.

<2.5.4 Dimensional Relation>

As shown in FIG. 2, in a case where the virtual line ELA that connects the first end e1 and the second end e2 of the first floating gate electrode FGA is drawn, the shortest distance Lmin1 between the virtual line ELA and the second floating gate electrode FGB is smaller than the shortest distance Lmin2 between the first word line WLA and the second word line WLB. For example, the shortest distance Lmin1 in the X direction between the first floating gate electrode FGA and the second floating gate electrode FGB facing each other in the X direction is smaller than the shortest distance Lmin2 in the X direction between the first word line WLA and the second word line WLB.

<3. Manufacturing Method>

Next, a method of manufacturing the semiconductor storage device 1 will be described. Processes other than those described below are disclosed in, for example, Specification of United States Patent Application Publication No. 2016/0336336, Specification of Japanese Patent Application No. 2019-043121, and the like. These documents are incorporated in this specification by reference in their entireties.

FIGS. 5A to 5J are cross-sectional views showing a part of a process of manufacturing the semiconductor storage device 1. Part (a) in each drawing is a cross-sectional view along line a-a in part (b) in each drawing. Part (b) in each drawing is a cross-sectional view along line b-b in part (a) in each drawing. Part (c) in each drawing is a cross-sectional view along line c-c in part (a) in each drawing.

Figure 5A:
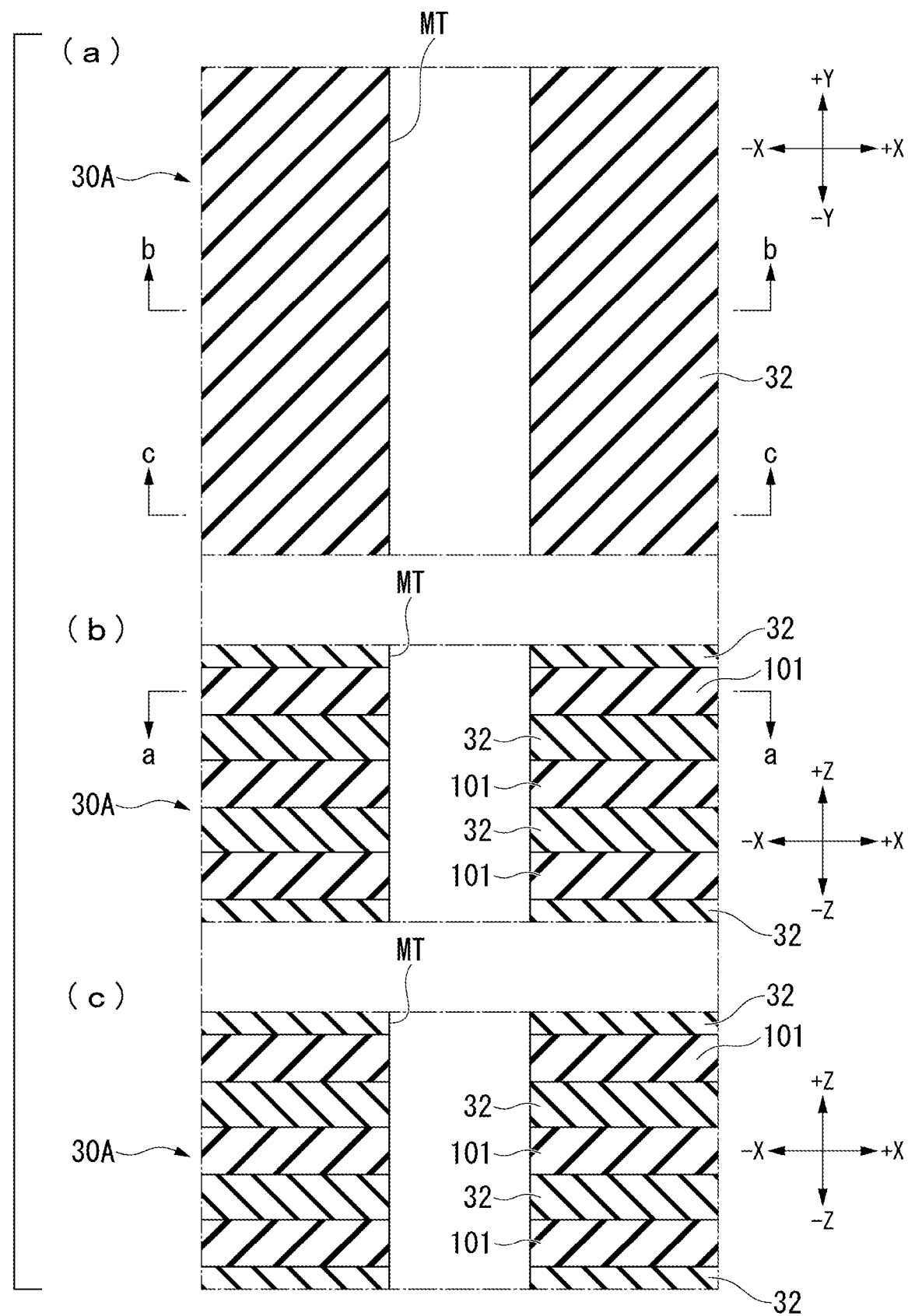
FIG. 5A is a cross-sectional view showing a part of a process of manufacturing the semiconductor storage device of the first embodiment.

First, as shown in FIG. 5A, a plurality of sacrificial films 101 and the plurality of insulating films (interlayer insulating films) 32 are laminated in the Z direction, so that an intermediate laminated body 30A is formed. A sacrificial film 101 is a layer which is to be replaced with a conductive layer which is the word line WL in a post-process. The sacrificial film 101 is formed of, for example, silicon nitride (SiN). The insulating film 32 is formed of, for example, silicon oxide (SiO). Next, a mask (not shown) is provided above the intermediate laminated body 30A, and a memory cell trench MT is formed by, for example, etching. The memory cell trench MT is a groove passing through the plurality of sacrificial films 101 and the plurality of insulating films 32 in the Z direction, and reaches the source line SL.

Figure 5B:
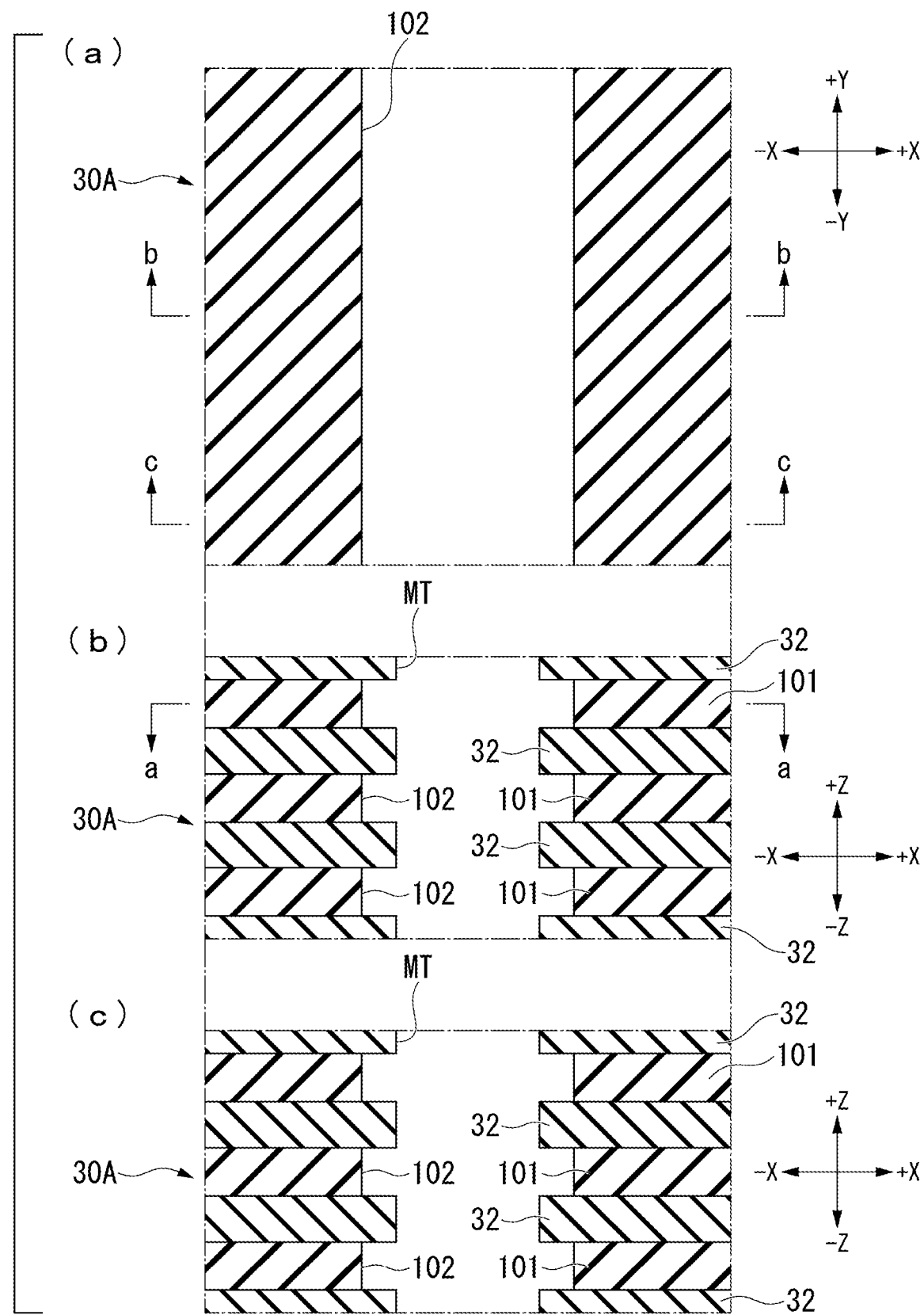
FIG. 5B is a cross-sectional view showing a part of the process of manufacturing the semiconductor storage device of the first embodiment.

Next, as shown in FIG. 5B, wet etching using a hot phosphoric acid ($H_3PO_4$) that is a chemical liquid for dissolving silicon nitride (SiN), for example, as an etchant is performed through the memory cell trench MT. Thereby, a portion of the sacrificial film 101 exposed to the memory cell trench MT is removed, and cavities 102 are formed on the lateral side of the memory cell trench MT.

Figure 5C:
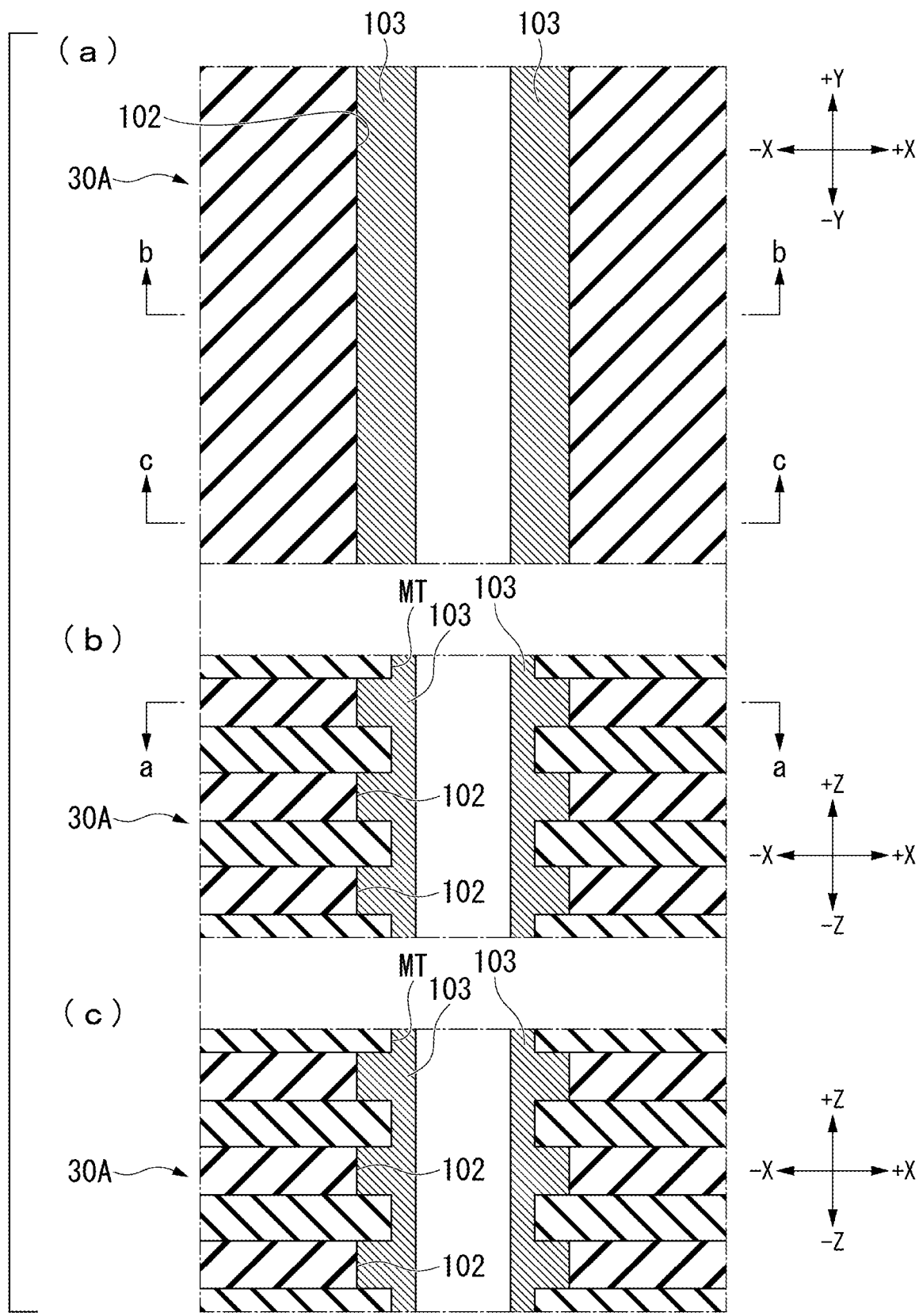
FIG. 5C is a cross-sectional view showing a part of the process of manufacturing the semiconductor storage device of the first embodiment.

Next, as shown in FIG. 5C, amorphous silicon (a-Si) is supplied into the inner surface of the memory cell trench MT and the inner surfaces of the cavities 102, and an intermediate generation film 103 consisting of amorphous silicon is formed.

Figure 5D:
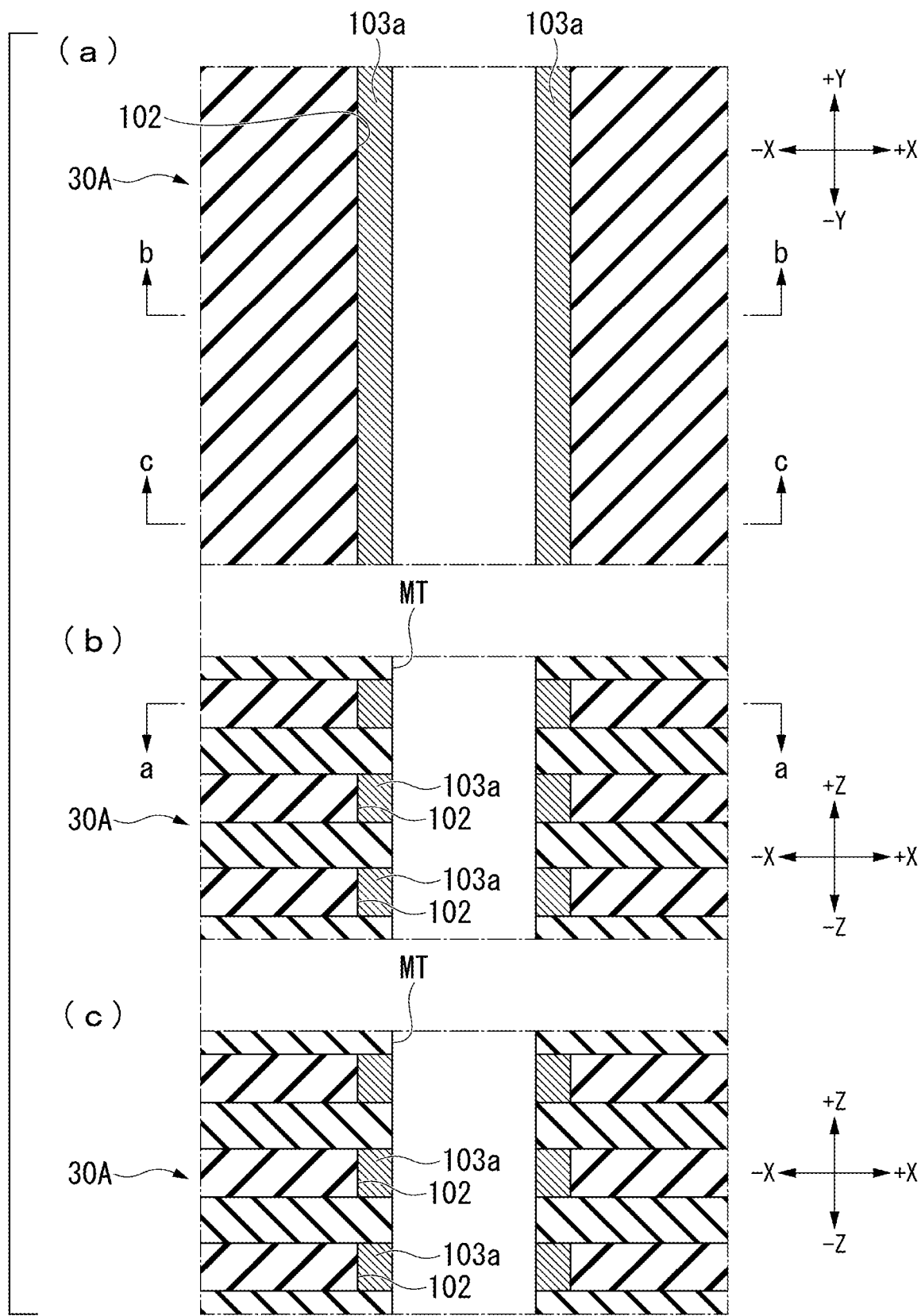
FIG. 5D is a cross-sectional view showing a part of the process of manufacturing the semiconductor storage device of the first embodiment.

Next, as shown in FIG. 5D, etching is performed through the memory cell trench MT, and the intermediate generation film 103 provided outside of the cavities 102 in the memory cell trench MT is removed. Thereby, remaining parts 103a of the intermediate generation film 103 remains inside the cavities 102.

Next, as shown in FIG. 5E, silicon oxide ($SiO_2$) is supplied into the memory cell trench MT, and an intermediate insulating layer 104 is formed. The intermediate insulating layer 104 is an insulating layer serving as the first insulator 71 by being cut in a post-process.

Figure 5F:
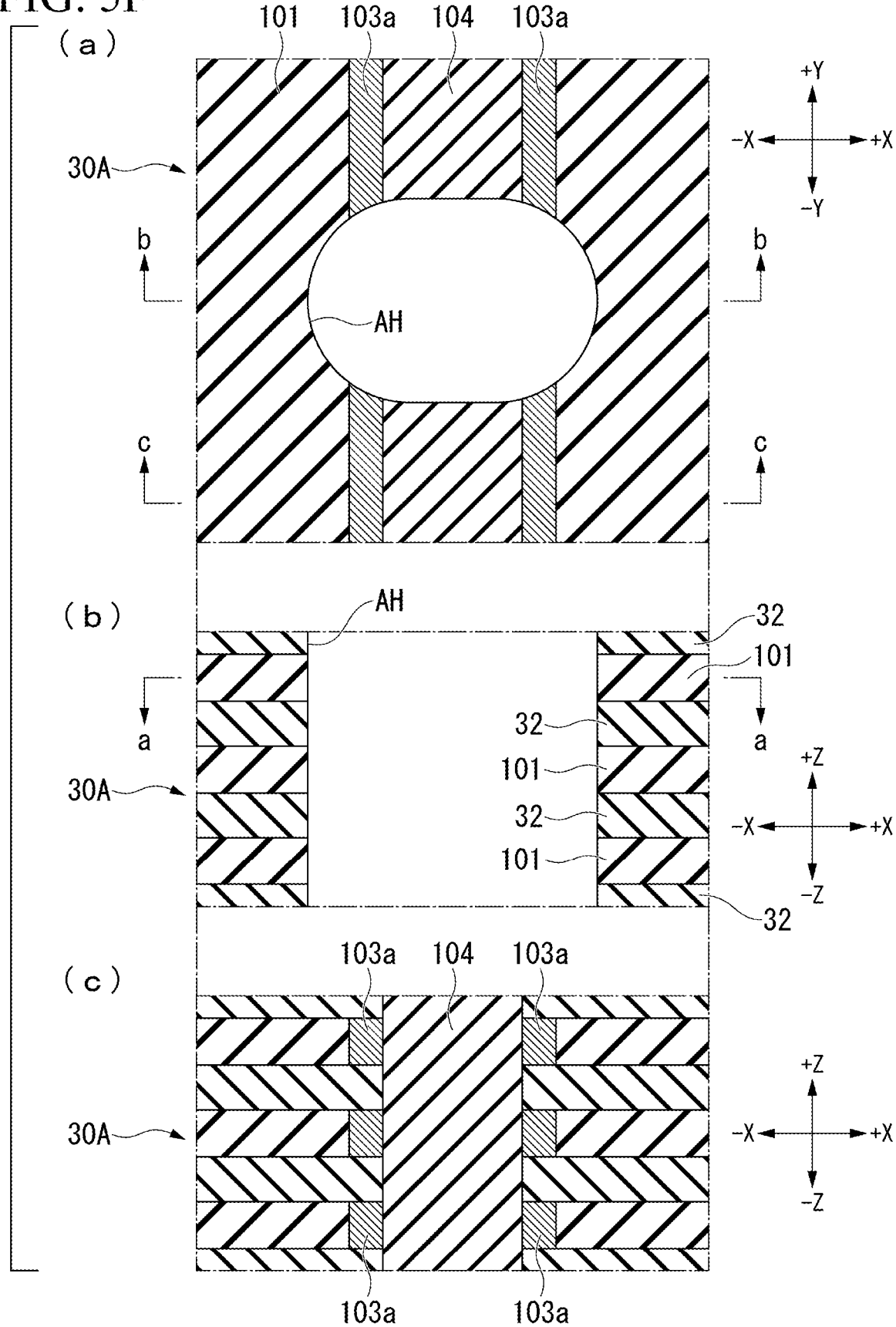
FIG. 5F is a cross-sectional view showing a part of the process of manufacturing the semiconductor storage device of the first embodiment.

Next, as shown in FIG. 5F, a mask (not shown) corresponding to the pillar 60 is provided above the intermediate laminated body 30A, and a memory hole AH is formed by, for example, etching. The memory hole AH is a hole passing through the plurality of sacrificial films 101, the plurality of insulating films 32, the remaining parts 103a of the intermediate generation film 103, and the intermediate insulating layer 104 in the Z direction, and reaches the source line SL. Thereby, the intermediate insulating layer 104 is cut into plural parts in the Y direction and is formed as a plurality of first insulators 71.

Figure 5G:
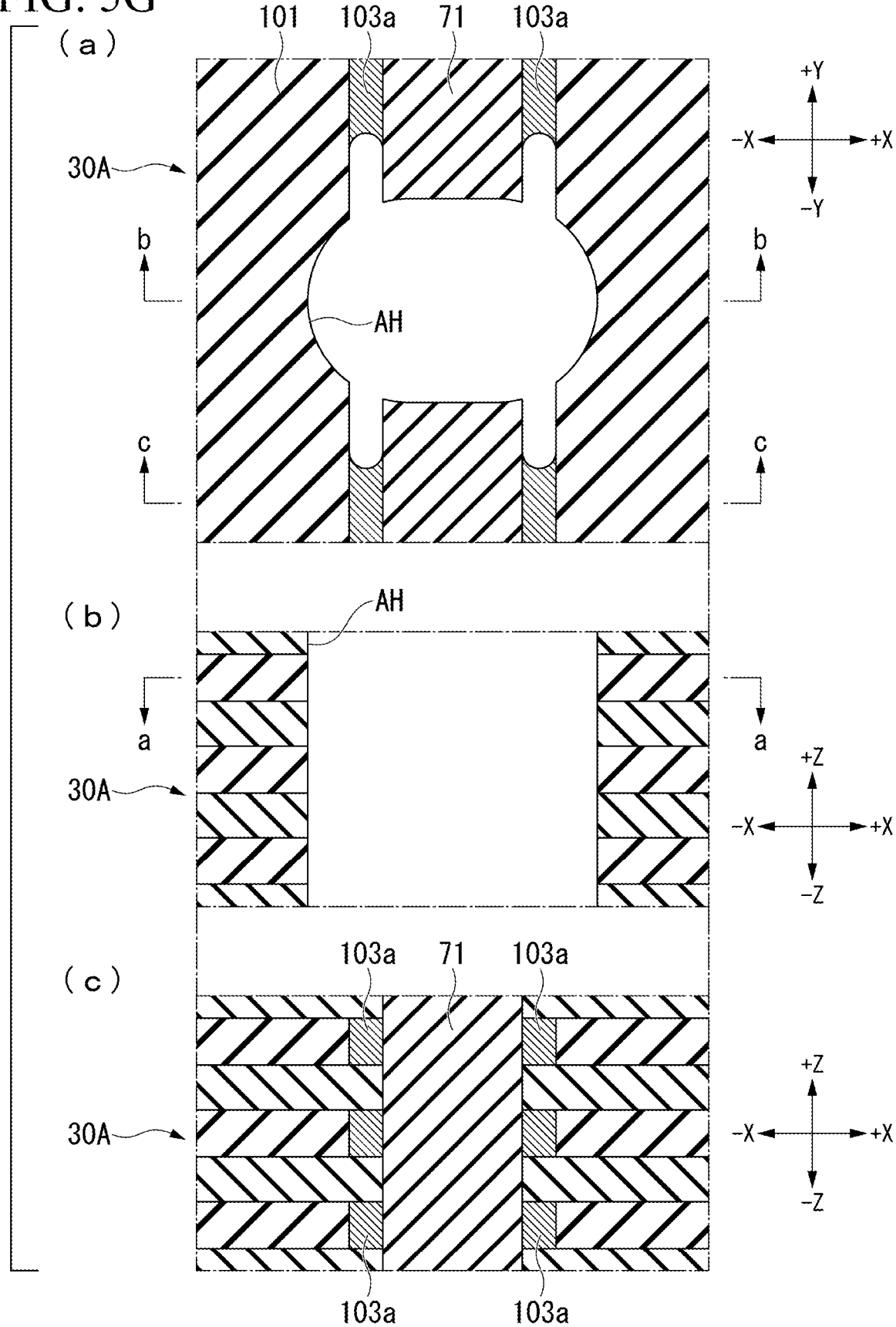
FIG. 5G is a cross-sectional view showing a part of the process of manufacturing the semiconductor storage device of the first embodiment.

Next, as shown in FIG. 5G, wet etching using a chemical liquid for dissolving amorphous silicon (a-Si), for example, as an etchant is performed. Thereby, portions of the remaining parts 103a of the intermediate generation film 103 exposed to the memory hole AH are removed.

Figure 5H:
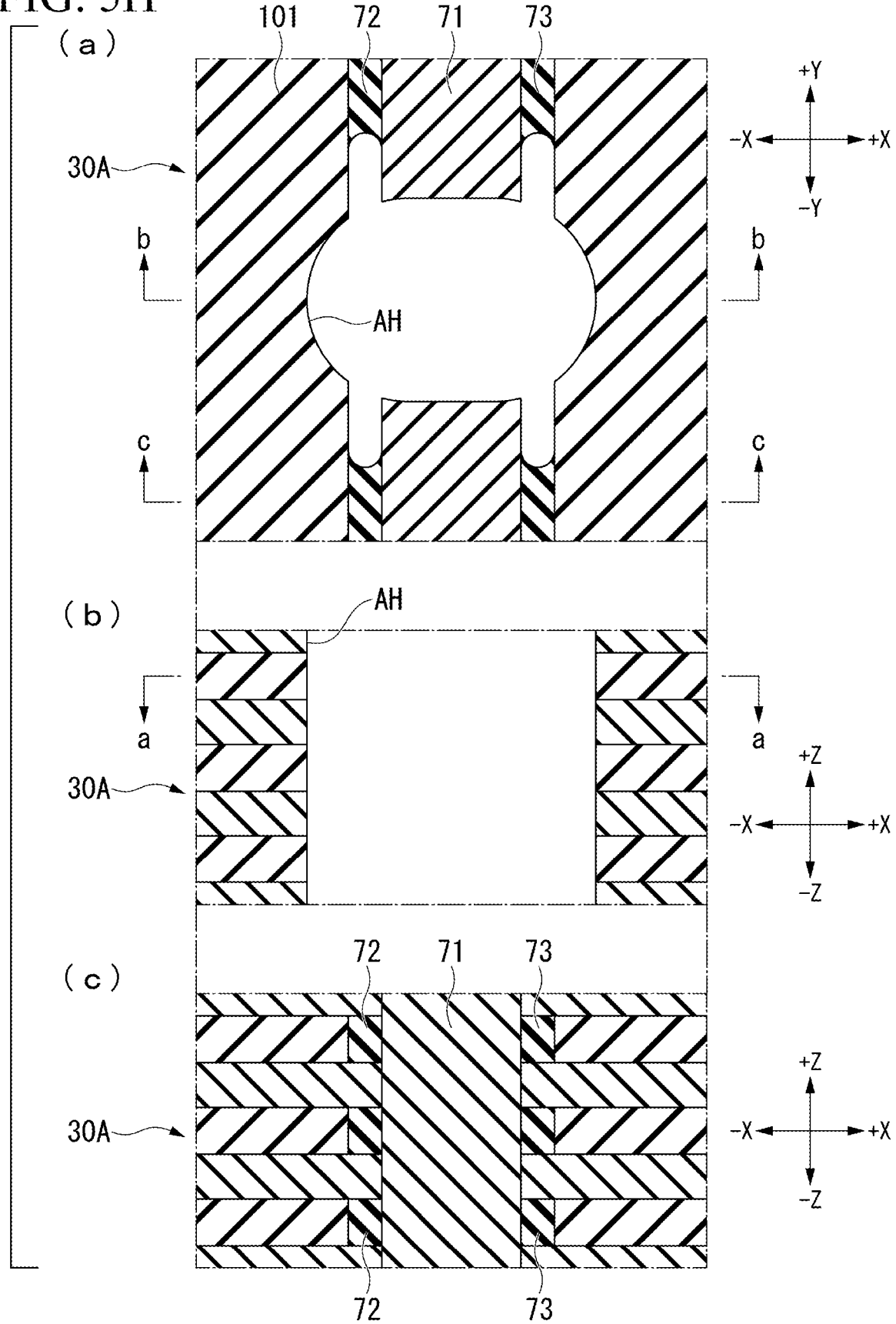
FIG. 5H is a cross-sectional view showing a part of the process of manufacturing the semiconductor storage device of the first embodiment.

Next, as shown in FIG. 5H, a process of oxidizing the remaining parts 103a of the intermediate generation film 103 which are amorphous silicon (a-Si) remaining in the intermediate laminated body 30A is performed. Thereby, the remaining parts 103a of the intermediate generation film 103 change to silicon oxide ($SiO_2$) which are insulators, and are formed as the second and third insulators 72 and 73.

Figure 5I:
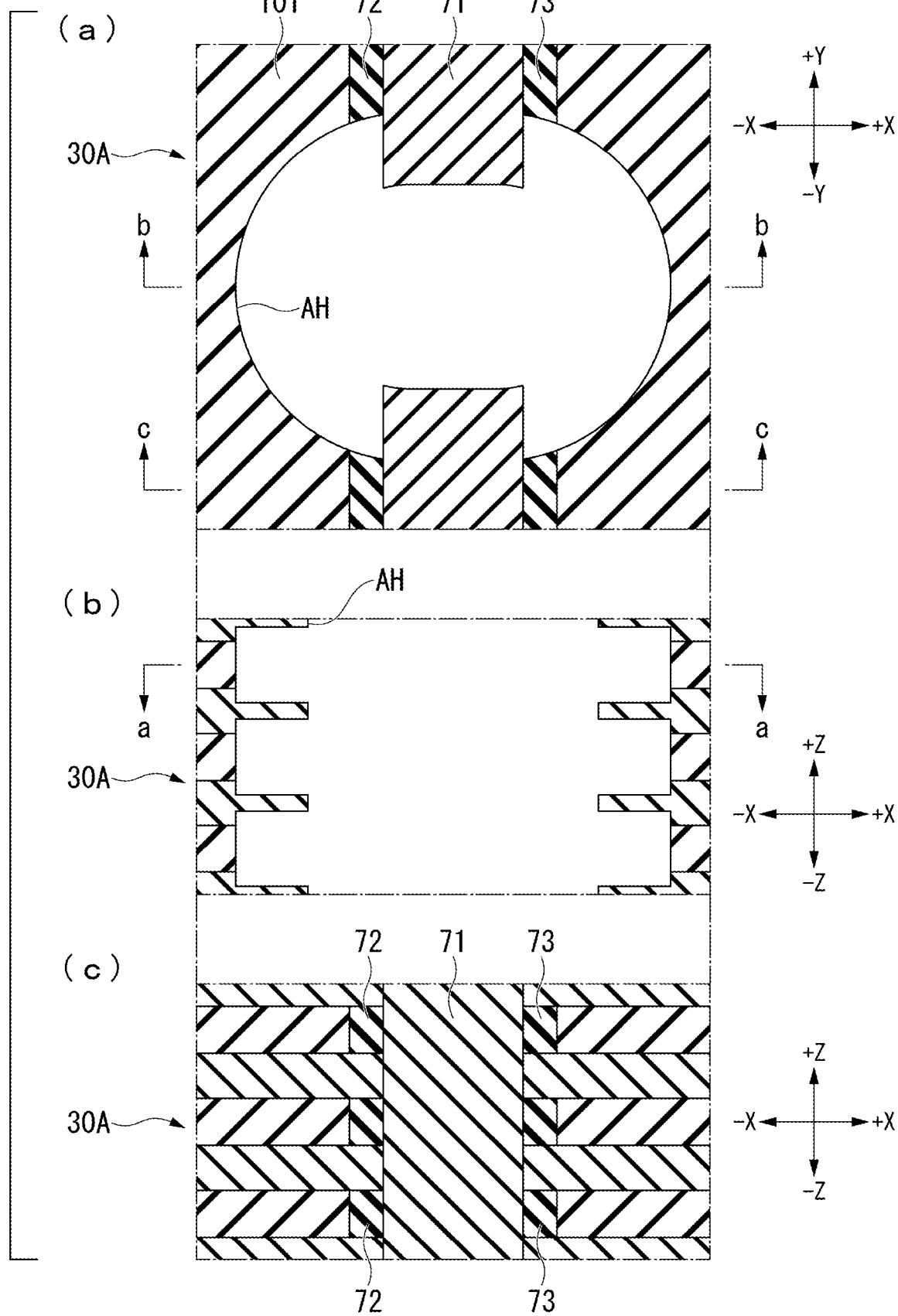
FIG. 5I is a cross-sectional view showing a part of the process of manufacturing the semiconductor storage device of the first embodiment.

Next, as shown in FIG. 5I, wet etching using a chemical liquid for dissolving silicon nitride (SiN), for example, as an etchant is performed. Thereby, some of the plurality of sacrificial films 101 exposed to the memory hole AH are removed.

Figure 5J:
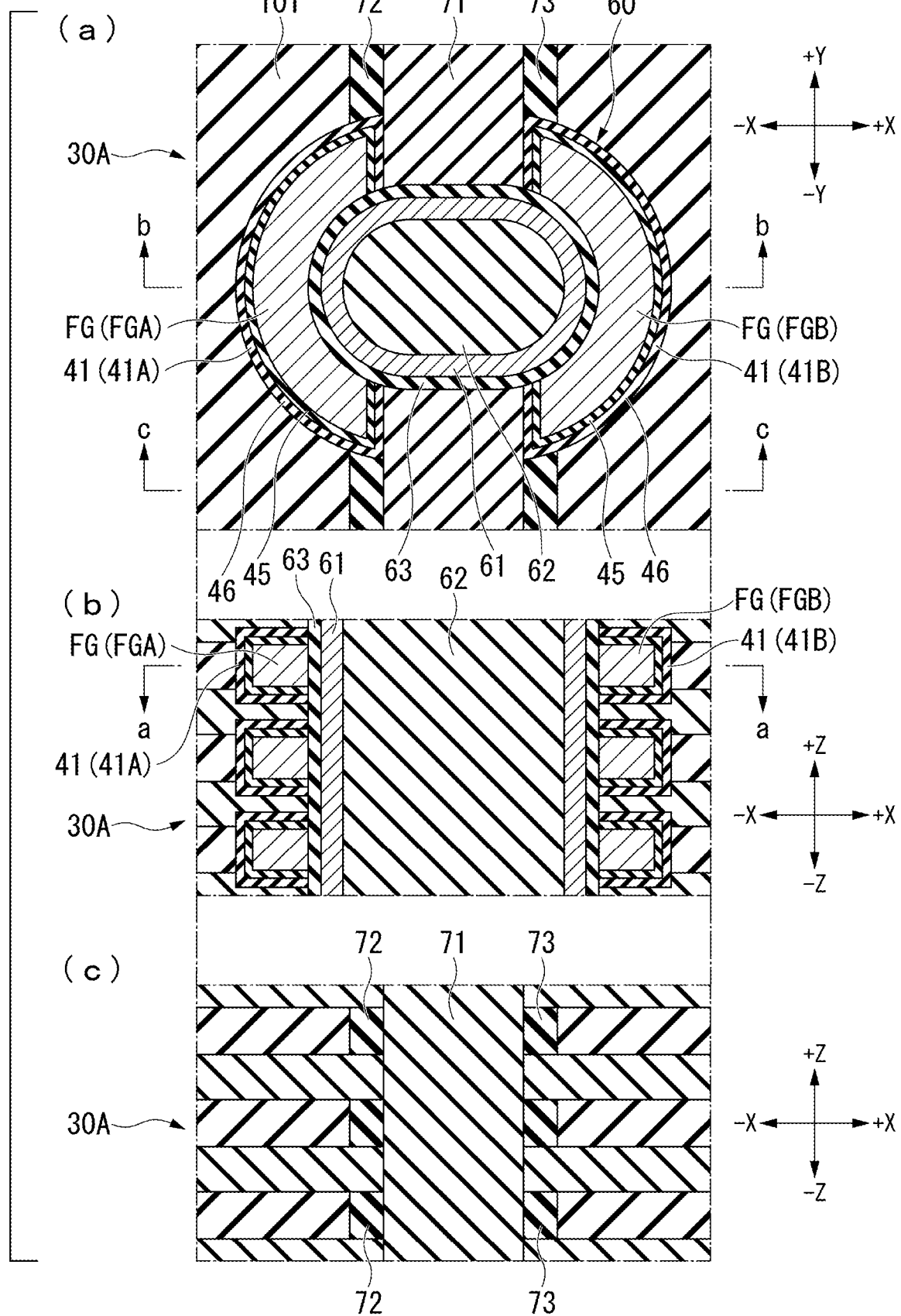
FIG. 5J is a cross-sectional view showing a part of the process of manufacturing the semiconductor storage device of the first embodiment.

Next, as shown in FIG. 5J, the insulating films 45 and 46 of the block insulating film 41, the floating gate electrode FG, the tunnel insulating film 63, the channel 61, and the core insulating part 62 are formed inside the memory hole AH. Thereby, most of the cell structure and the pillar 60 are formed.

Next, wet etching is performed through another trench (not shown) provided in the intermediate laminated body 30A, and the plurality of sacrificial films 101 are removed. An insulating film 47 of the block insulating film 41 and the word line WL are formed sequentially in a space formed by the sacrificial film 101 being removed. Thereafter, the contacts 91 to 94, the interconnection 81 to 83, and the like are formed. Thereby, the semiconductor storage device 1 is completed.

<4. Advantage>

Here, as a comparative example, a semiconductor storage device in which the second and third insulators 72 and 73 are not present is considered. In such a semiconductor storage device, that is, a configuration in which the first floating gate electrode FGA and the second floating gate electrode FGB are separated by the first insulator 71, a portion which is not covered with the floating gate electrodes FGA and FGB in the channel 61 is influenced due to a voltage applied to the word line WL being wrapped around, and thus, for example, the readout characteristics of the semiconductor storage device 1 may decrease. In order to suppress such a decrease in the readout characteristics, it is necessary to increase the size of the floating gate electrode FG, which leads to an increase in the size of the semiconductor storage device 1.

Consequently, in the present embodiment, the second insulator 72 is provided between the first word line WLA and the first insulator 71, and the third insulator 73 is provided between the second word line WLB and the first insulator 71. According to such a configuration, it is possible to increase a distance between the word line WL and the portion which is not covered with the floating gate electrodes FGA and FGB in the channel 61. Therefore, it is possible to suppress the influence of a voltage applied to the word line WL on the channel 61. Thereby, it is possible to improve the readout characteristics of the semiconductor storage device 1. As a result, it is possible to achieve a reduction in the size of the floating gate electrode FG, and to achieve a reduction in the size of the semiconductor storage device 1.

In the present embodiment, the first floating gate electrode FGA has the inner surface Si adjacent to the first channel part 61A and the outer surface S2 located on the opposite side of the inner surface S1. The maximum thickness of the second insulator 72 in the X direction is smaller than a maximum distance between the virtual line ELA that connects the first end e1 and the second end e2 of the first floating gate electrode FGA and the outer surface S2 of the first floating gate electrode FGA. In a case where such a configuration, that is, the thickness of the second insulator 72 is not excessively large, the word line WL is also located on both sides of the floating gate electrode FG in the Y direction, and thus a voltage has a tendency to be applied to the floating gate electrode FG from the word line WL. Thereby, it is possible to improve the writing characteristics of the semiconductor storage device 1.

(Modification of Configuration)

Figure 6:
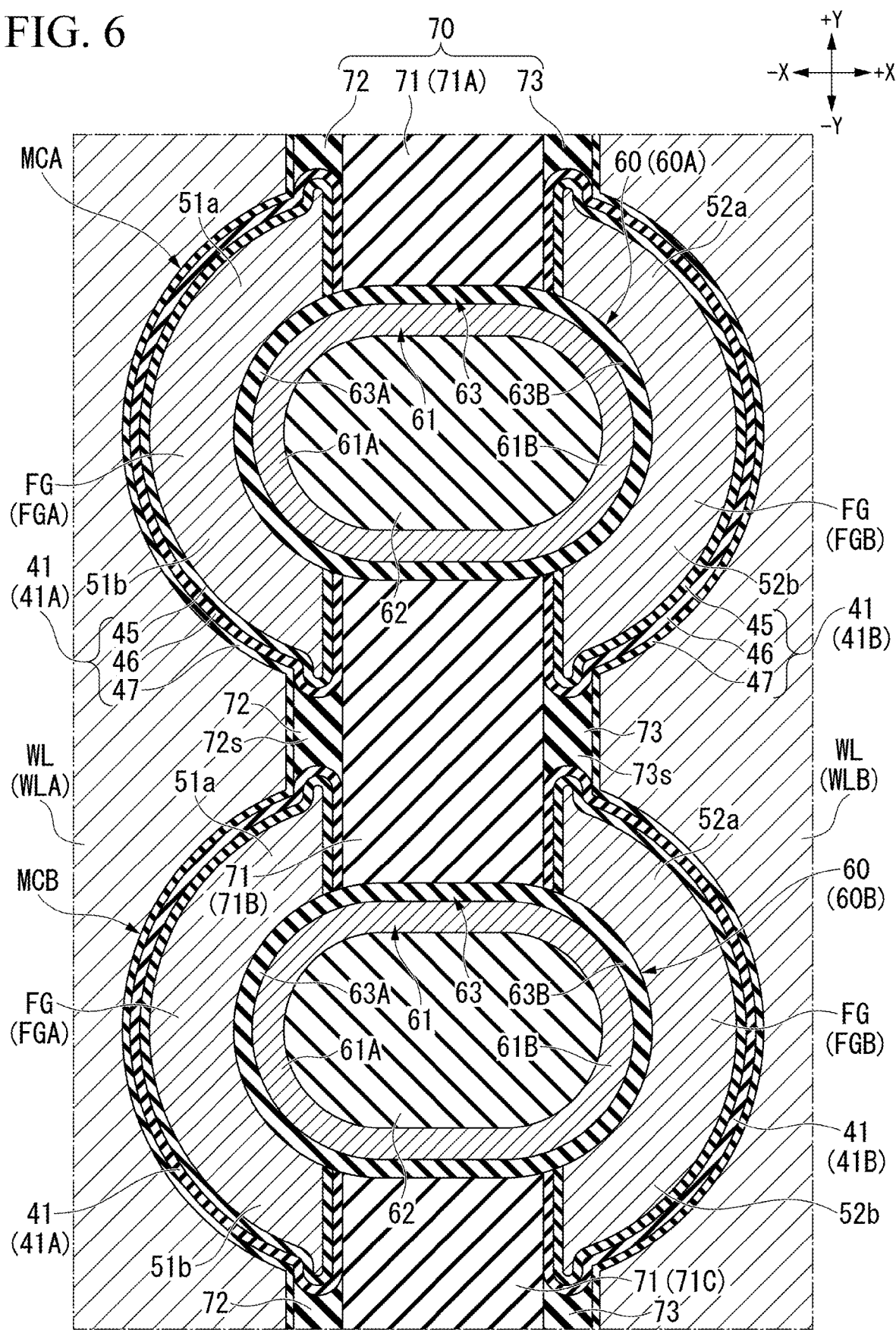
FIG. 6 is a cross-sectional view showing a semiconductor storage device of a modification of the first embodiment.

FIG. 6 is a cross-sectional view showing a semiconductor storage device 1 of a modification of the first embodiment. As shown in FIG. 6, the floating gate electrode FG is not required to be formed in a delicate arc shape like the first embodiment. For example, depending on the content of a process of etching the intermediate generation film 103 which is the base of the second and third insulators 72 and 73 (a process shown in FIG. 5H), as shown in FIG. 6, the end of the floating gate electrode FG in the +Y direction and the end thereof in the −Y direction may protrude partially.

(Modification of Manufacturing Method)

A method of manufacturing the semiconductor storage device 1 is not limited to the above-described example. For example, a case where a material having resistance to an etchant for dissolving a material (for example, $SiO_2$) of the first insulator 71 is used as a material of the second and third insulators 72 and 73 is as follows. That is, in the above-described process of FIG. 5C, the intermediate generation film 103 is formed of an insulating material for forming the second and third insulators 72 and 73. In this case, the intermediate generation film 103 is formed as the second and third insulators 72 and 73 without performing the above-described process of FIG. 5H (the process of oxidizing the intermediate generation film 103).

Second Embodiment

Next, a second embodiment will be described. The second embodiment is different from the first embodiment, in which the thickness of the second and third insulators 72 and 73 in the X direction is relatively large. Configurations other than those described below are the same as those in the first embodiment.

Figure 7:
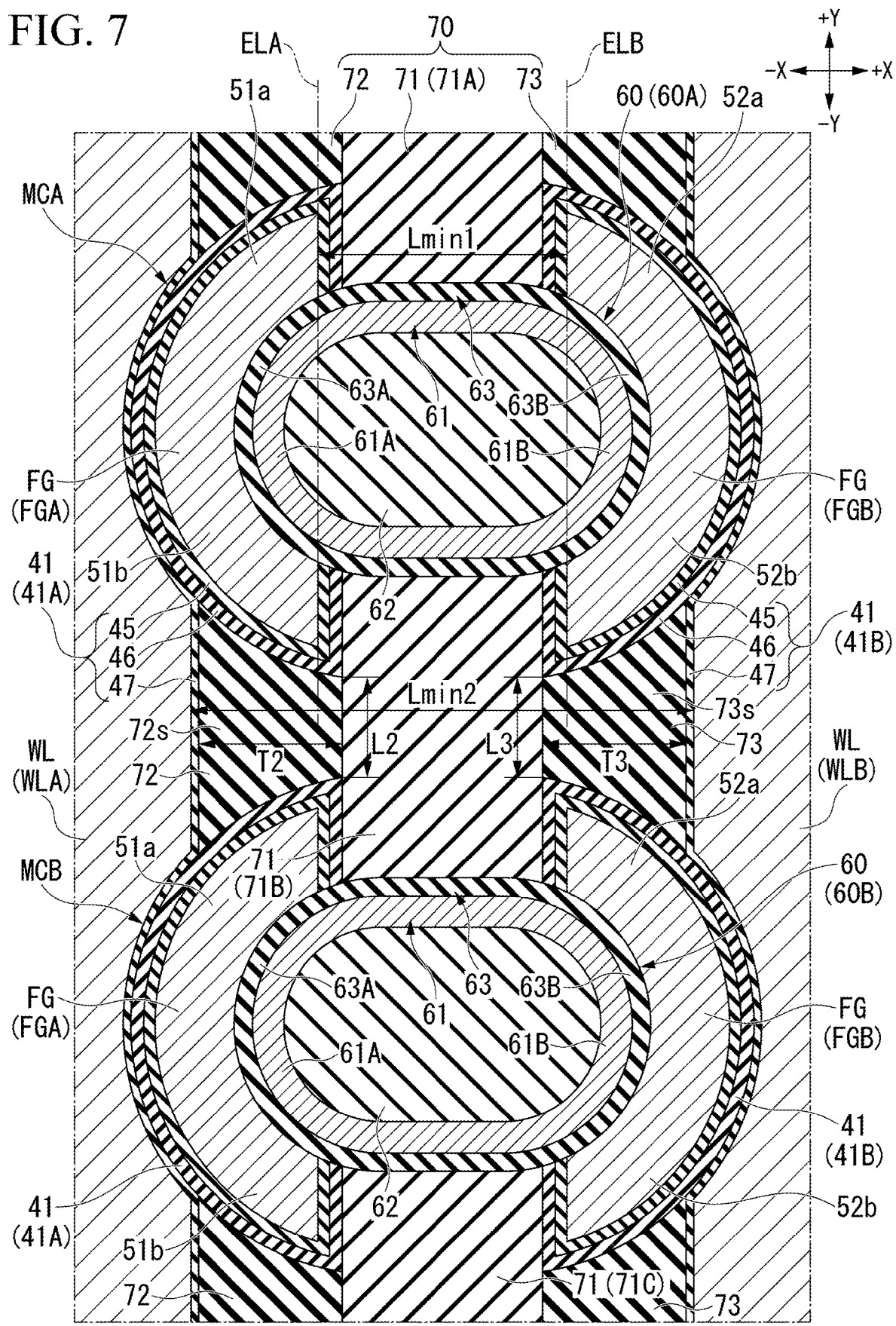
FIG. 7 is a cross-sectional view showing a semiconductor storage device of a second embodiment.

FIG. 7 is a cross-sectional view showing a semiconductor storage device 1 of the second embodiment. In the present embodiment, the minimum thickness T2 (or the maximum thickness) of the second insulator 72 in the X direction is larger than the length L2 of a shortest portion of the second insulator 72 in the Y direction (that is, the shortest length of the second insulator 72 in the Y direction). The second insulator 72 is formed in a trapezoidal shape in which the length thereof in the Y direction becomes larger as being farther in the −X direction. Similarly, the minimum thickness T3 (or the maximum thickness) of the third insulator 73 in the X direction is larger than the length L3 of a shortest portion of the third insulator 73 in the Y direction (that is, the shortest length of the third insulator 73 in the Y direction). The third insulator 73 is formed in a trapezoidal shape in which the length thereof is the Y direction becomes larger as being farther in the +X direction.

In the present embodiment, a portion of the second insulator 72 is provided between the first word line WLA and the first floating gate electrode FGA in the X direction. For example, a portion of the second insulator 72 is provided between the first word line WLA and the first portion (the first curved part) 51a of the first floating gate electrode FGA and between the first word line WLA and the second portion (the second curved part) 51b of the first floating gate electrode FGA, in the X direction.

Similarly, a portion of the third insulator 73 is provided between the second word line WLB and the second floating gate electrode FGB in the X direction. For example, a portion of the third insulator 73 is provided between the second word line WLB and the first portion (the first curved part) 52a of the second floating gate electrode FGB and between the second word line WLB and the second portion (the second curved part) 52b of the second floating gate electrode FGB, in the X direction.

According to such a configuration, it is possible to further suppress the influence of a voltage applied to the word line WL on the channel 61 than in the first embodiment. Thereby, the electrical characteristics of the semiconductor storage device 1 may be further improved.

Third Embodiment

Next, a third embodiment will be described. The third embodiment is different from the second embodiment, in which the thickness of the second and third insulators 72 and 73 in the X direction is larger than in the second embodiment. Configurations other than those described below are the same as those in the second embodiment.

Figure 8:
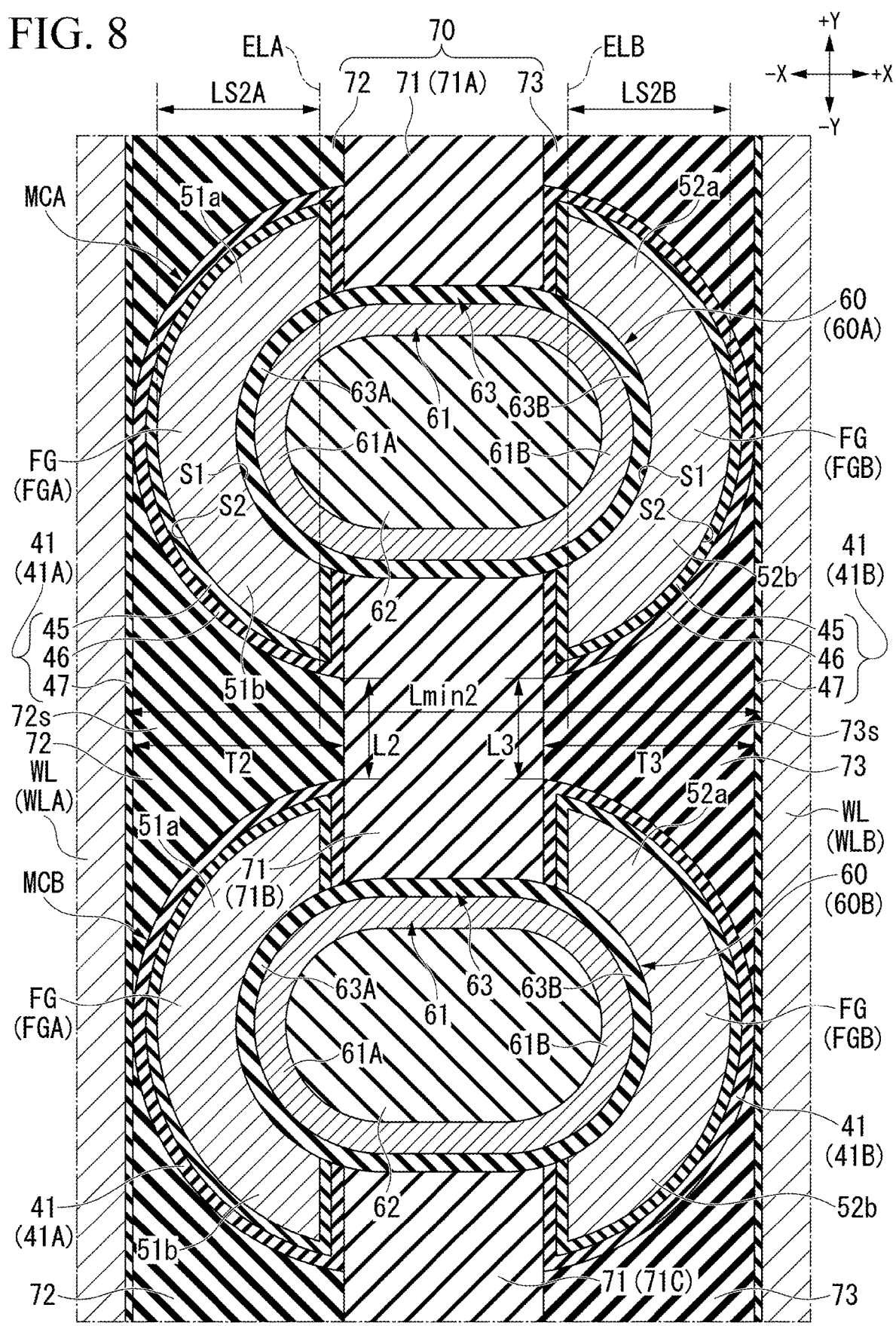
FIG. 8 is a cross-sectional view showing a semiconductor storage device of a third embodiment.

FIG. 8 is a cross-sectional view showing a semiconductor storage device 1 of the third embodiment. In the present embodiment, the maximum thickness of the second insulator 72 in the X direction is equal to or larger than the maximum distance LS2A between the virtual line ELA that connects the first end e1 and the second end e2 of the first floating gate electrode FGA and the outer surface S2 of the first floating gate electrode FGA. Similarly, the maximum thickness of the third insulator 73 in the X direction is equal to or larger than the maximum distance LS2B between the virtual line ELB that connects the first end e3 and second end e4 of the second floating gate electrode FGB and the outer surface S2 of the second floating gate electrode FGB.

According to such a configuration, it is possible to further suppress the influence of a voltage applied to the word line WL on the channel 61 than in the first embodiment. Thereby, the electrical characteristics of the semiconductor storage device 1 may be further improved.

Fourth Embodiment

Next, a fourth embodiment will be described. The fourth embodiment is different from the first embodiment, in which the channel 61 and the tunnel insulating film 63 are separated by the first insulator 71. Configurations other than those described below are the same as those in the first embodiment.

Figure 9:
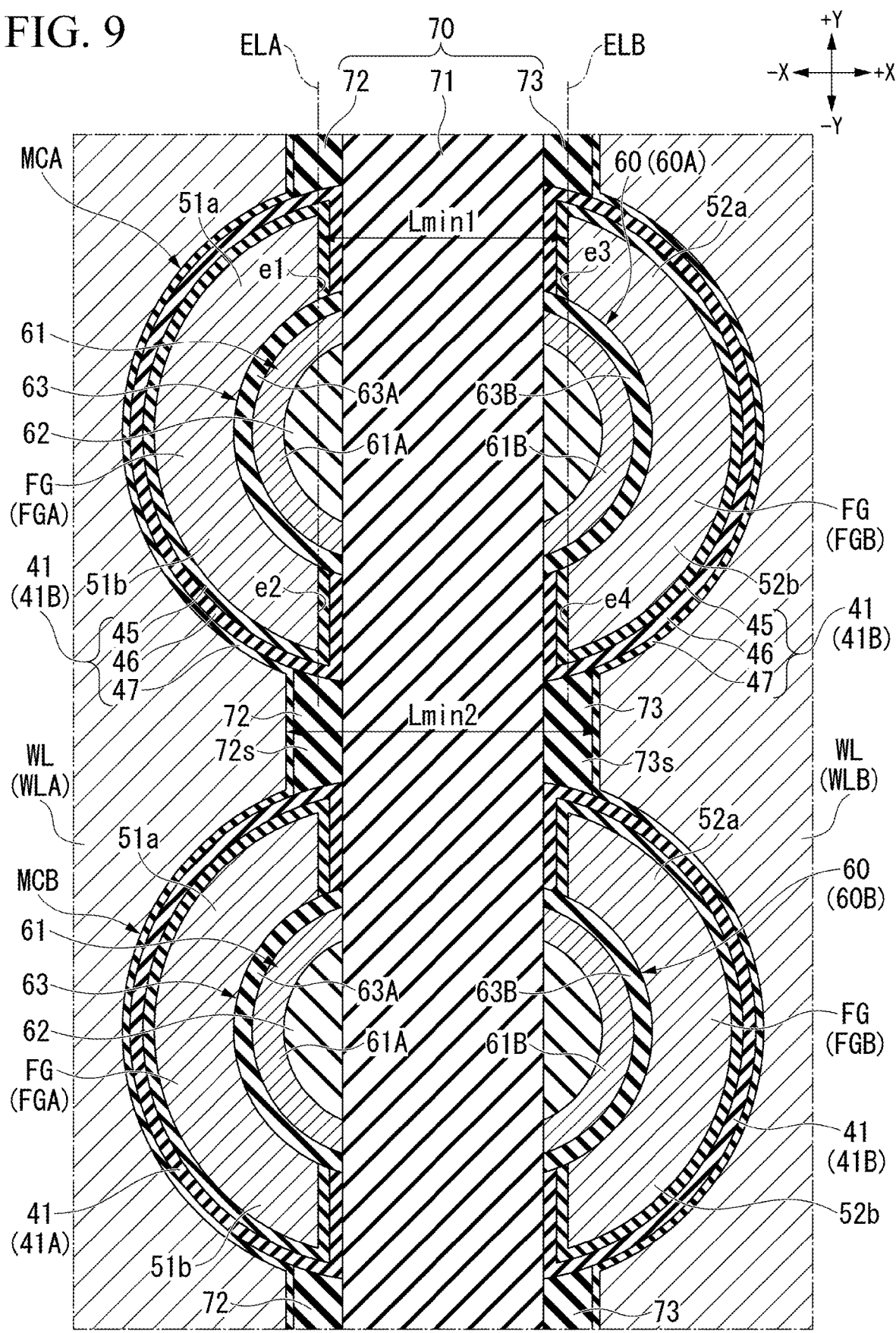
FIG. 9 is a cross-sectional view showing a semiconductor storage device of a fourth embodiment.

FIG. 9 is a cross-sectional view showing a semiconductor storage device 1 of the fourth embodiment. In the present embodiment, the first insulator 71 passes through the plurality of pillars 60 (for example, the first pillar 60A and the second pillar 60B) in the Y direction. The first insulator 71 extends in the Y direction between the first channel part 61A and the second channel part 61B. In other words, the first channel part 61A and the second channel part 61B are separated by the first insulator 71 in the X direction, and are electrically insulated from each other. In addition, the first insulator 71 extends in the Y direction between the first tunnel insulating film 63A and the second tunnel insulating film 63B. In other words, the first tunnel insulating film 63A and the second tunnel insulating film 63B are separated by the first insulator 71 in the X direction.

With such a configuration, similarly to the first embodiment, it is also possible to improve the electrical characteristics of the semiconductor storage device 1.

Fifth Embodiment

Next, a fifth embodiment will be described. The fifth embodiment is different from the first embodiment, in which the pillar 60 is formed in a rectangular annular shape. Configurations other than those described below are the same as those in the first embodiment.

Figure 10:
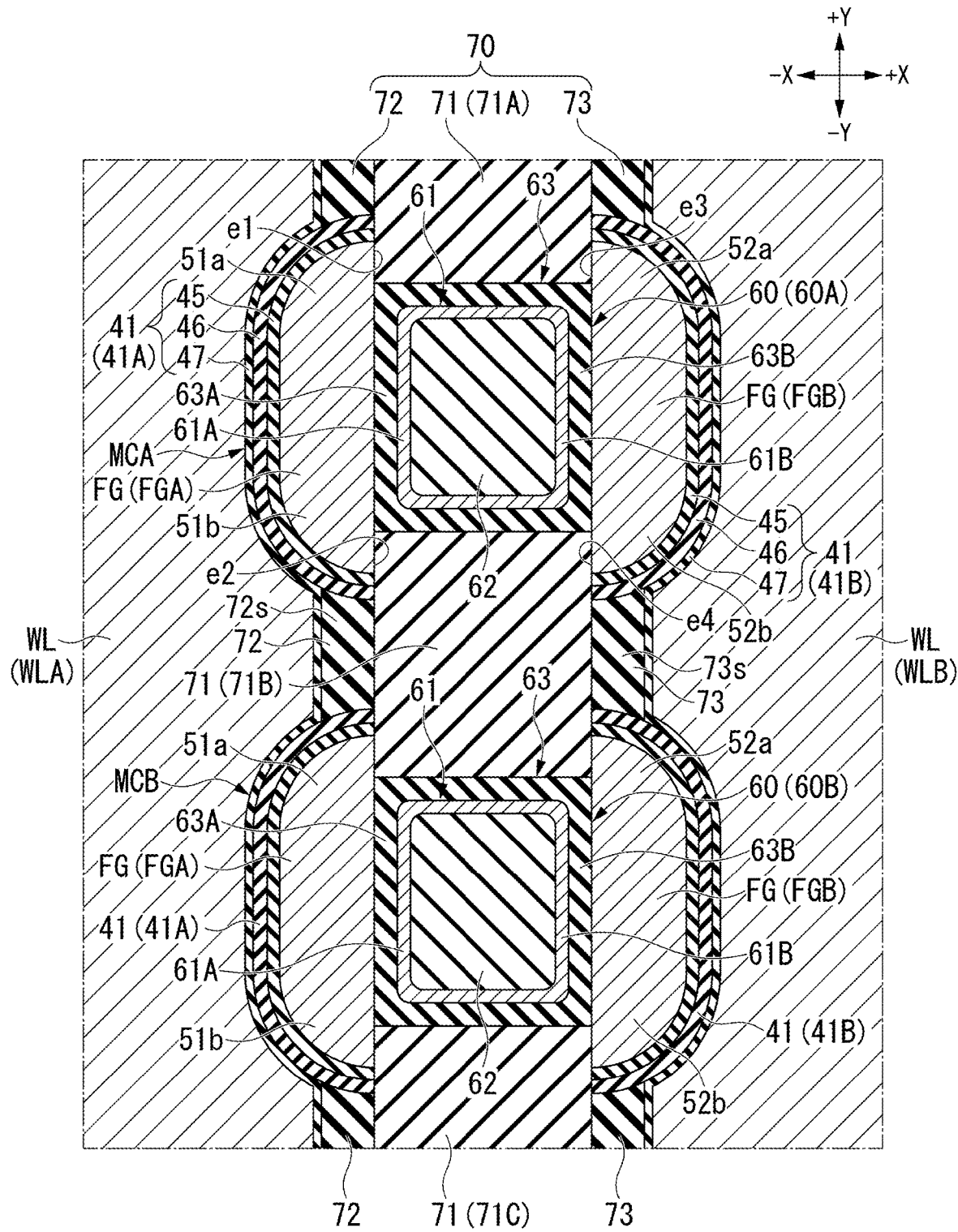
FIG. 10 is a cross-sectional view showing a semiconductor storage device of a fifth embodiment.

FIG. 10 is a cross-sectional view showing a semiconductor storage device 1 of the fifth embodiment. In the present embodiment, the channel 61 and the tunnel insulating film 63 are formed in a rectangular annular shape. The channel 61 and the tunnel insulating film 63 do not protrude from the first insulator 71 in the X direction. In the present embodiment, each of the first floating gate electrode FGA and the second floating gate electrode FGB includes a portion extending linearly in the Y direction along the first insulator 71 and the tunnel insulating film 63.

With such a configuration, similarly to the first embodiment, it is also possible to improve the electrical characteristics of the semiconductor storage device 1.

Sixth Embodiment

Next, a sixth embodiment will be described. The sixth embodiment is different from the first embodiment, in which the second insulator 72 is divided between the first cell structure MCA and the second cell structure MCB. Configurations other than those described below are the same as those in the first embodiment.

Figure 11:
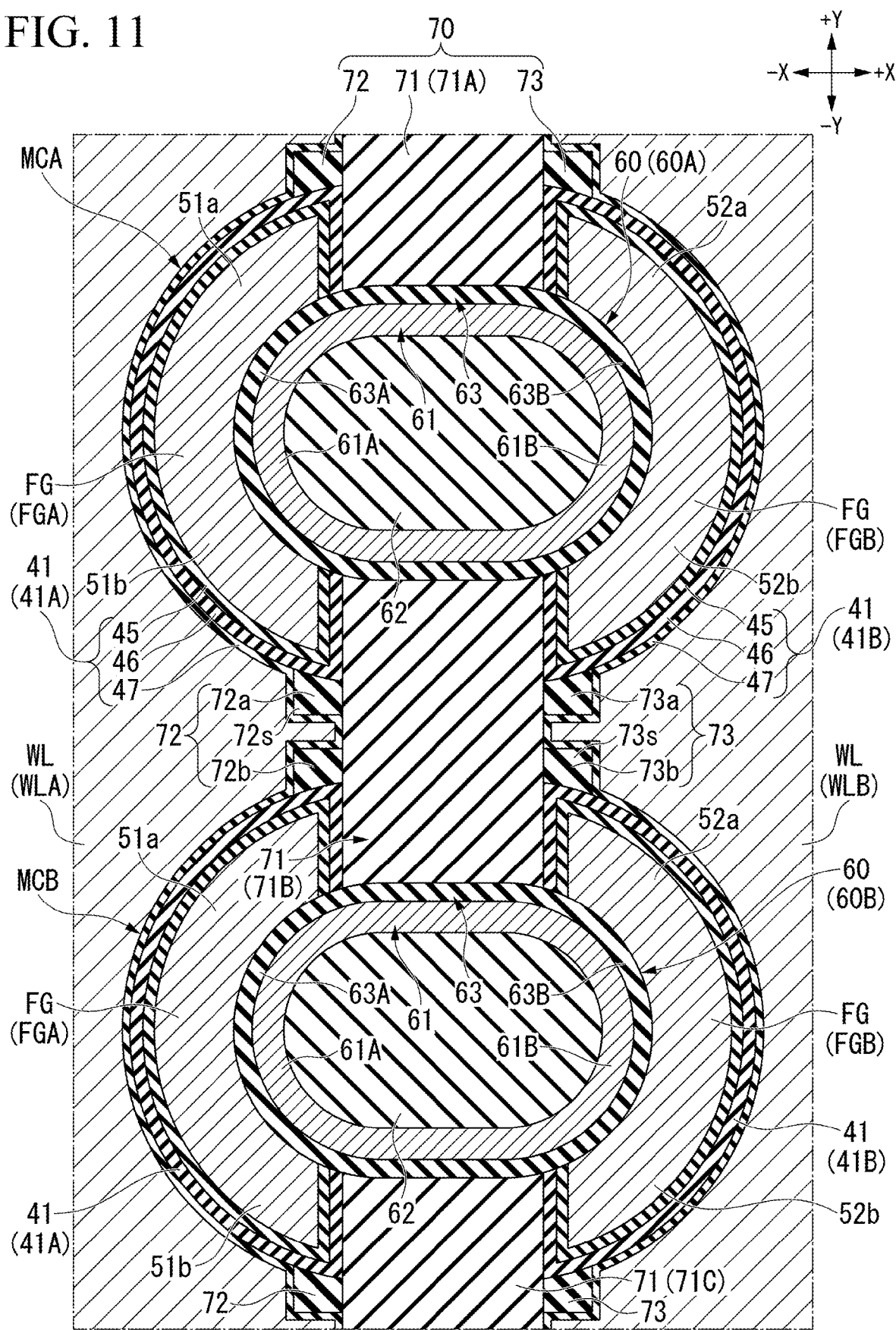
FIG. 11 is a cross-sectional view showing a semiconductor storage device of a sixth embodiment.

FIG. 11 is a cross-sectional view showing a semiconductor storage device 1 of the sixth embodiment. In the present embodiment, the second insulator 72 is divided between the first cell structure MCA and the second cell structure MCB in the Y direction, and is divided into a first portion 72a which is in contact with the first cell structure MCA and a second portion 72b which is in contact with the second cell structure MCB. A portion of the first word line WLA is provided between the first portion 72a and the second portion 72b.

Similarly, the third insulator 73 is divided between the first cell structure MCA and the second cell structure MCB in the Y direction, and is divided into a first portion 73a which is in contact with the first cell structure MCA and a second portion 73b which is in contact with the second cell structure MCB. A portion of the second word line WLB is provided between the first portion 73a and the second portion 73b.

With such a configuration, the second and third insulators 72 and 73 are provided, and thus it is possible to improve the electrical characteristics of the semiconductor storage device 1.

Seventh Embodiment

Next, a seventh embodiment will be described. In the seventh embodiment, shapes of floating gate electrodes FG, insulators 72 and 73, and the like are different from those in the first embodiment. Configurations other than those described below are the same as those in the first embodiment.

Figure 12:
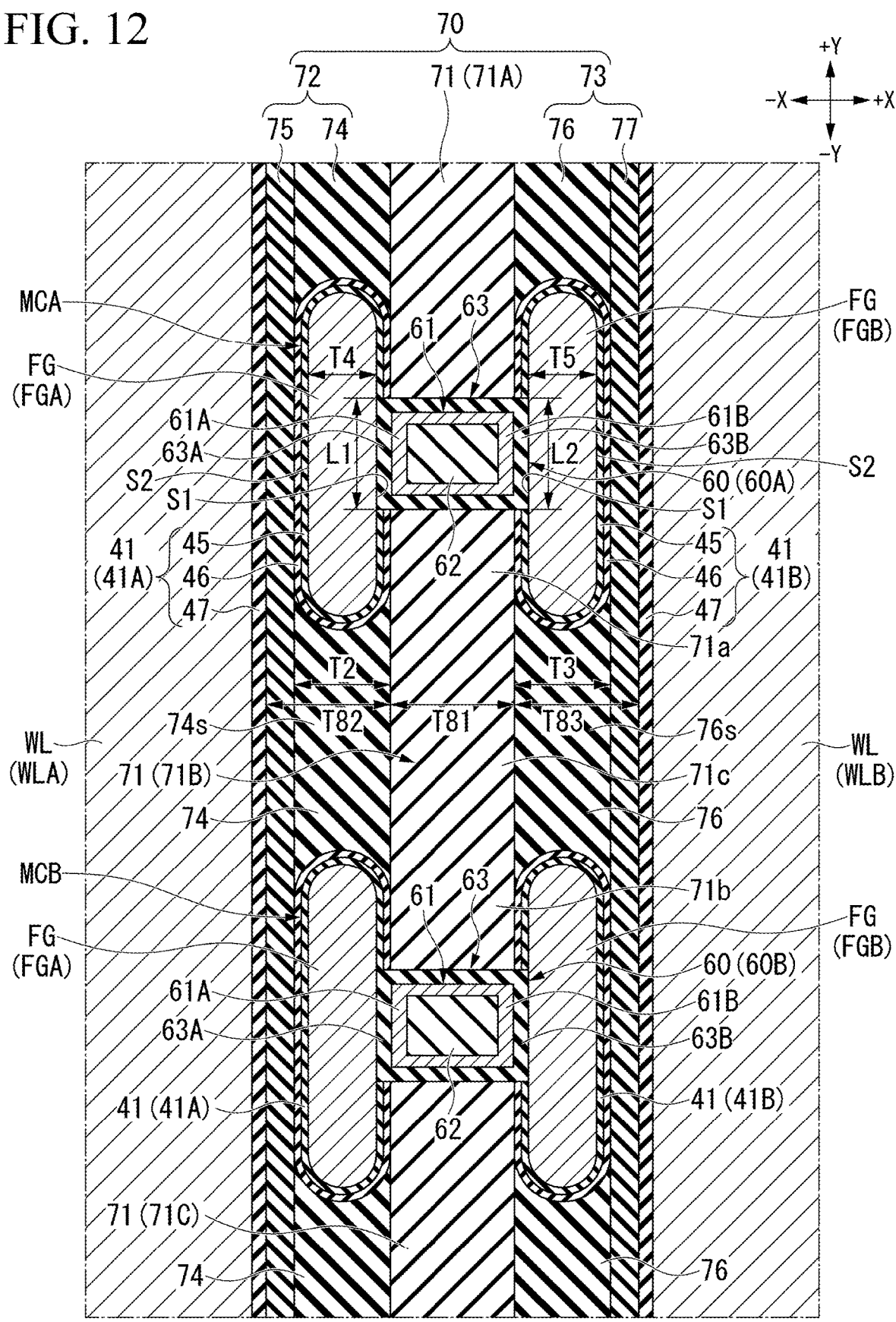
FIG. 12 is a cross-sectional view showing a semiconductor storage device of a seventh embodiment.

FIG. 12 is a cross-sectional view showing a semiconductor storage device 1 of the seventh embodiment.

<5.1 Word Line>

In the present embodiment, word lines WL extend linearly in the Y direction. For example, an end (an edge) of the first word line WLA in the +X direction is located on the −X direction side compared to an end (an edge) of the first floating gate electrode FGA in the −X direction. The end (the edge) of the first word line WLA in the +X direction extends linearly in the Y direction. Similarly, an end of (an edge) the second word line WLB in the −X direction is located on the +X direction side compared to an end (an edge) of the second floating gate electrode FGB in the +X direction. The end (the edge) of the second word line WLB in the −X direction extends linearly in the Y direction.

<5.2 Floating Gate Electrode>

In the present embodiment, floating gate electrodes FG extend linearly in the Y direction. In a sectional view along the X direction and the Y direction, an end of the floating gate electrode FG in the +Y direction is in a semicircular shape projecting in the +Y direction. Similarly, in the sectional view along the X direction and the Y direction, an end of the floating gate electrode FG in the −Y direction is in a semicircular shape projecting in the −Y direction. The floating gate electrode FG includes a liner portion that extends in the Y direction between the end portion in the +Y direction and the end portion in the −Y direction of the floating gate electrode FG. A width of the liner portion of the floating gate electrode FG in the X direction is constant. The liner portion floating gate electrode FG extends longer than a pillar 60 in the Y direction.

In the example shown in the FIG. 12, the thickness of the floating gate electrode FG in the X direction is larger than the thickness of the tunnel insulating film 63 (for example, the thickness of the first tunnel insulating film 63A or the thickness of the second tunnel insulating film 63B), or the thickness of the block insulating films 41. However, the thickness of the floating gate electrode FG in the X direction may be the substantially same as the thickness of the tunnel insulating film 63 (for example, the thickness of the first tunnel insulating film 63A or the thickness of the second tunnel insulating film 63B), or the thickness of the block insulating films 41. Those relationships may be the same as those in the other embodiments described above.

<5.3 Block Insulating Film>

In the present embodiment, each of two insulating films 45 and 46 of a first block insulating film 41A includes a portion provided between the first word line WLA and the first floating gate electrode FGA, and a portion provided between a first insulator 71 and the first floating gate electrode FGA. In the present embodiment, a part of each of the insulating films 45 and 46 of the first block insulating film 41A is provided between the first floating gate electrode FGA and a second insulator 72 in the Y direction.

On the other hand, an insulating film 47 of the first block insulating film 41A is provided between the first word line WLA and the first floating gate electrode FGA in the X direction. In this embodiment, the insulating film 47 is provided between the first word line WLA and the second insulator 72 in the X direction. The insulating film 47 extends linearly in the Y direction along the end (the edge) of the first word line WLA in the +X direction. A thickness (for example, a minimum thickness) of the insulating film 47 in the X direction is larger than a thickness (for example, a minimum thickness) of the insulating film 45 in the X direction, or a thickness (for example, a minimum thickness) of the insulating film 46 in the X direction. An example of the insulating film 47 is formed of aluminum oxide ($Al_2O_3$).

Similarly, each of two insulating films 45 and 46 of a second block insulating film 41B includes a portion provided between the second word line WLB and the second floating gate electrode FGB, and a portion provided between the first insulator 71 and the second floating gate electrode FGB. In the present embodiment, a part of each of the insulating films 45 and 46 of the second block insulating film 41B is provided between the second floating gate electrode FGB and a third insulator 73 in the Y direction.

On the other hand, an insulating film 47 of the second block insulating film 41B is provided between the second word line WLB and the second floating gate electrode FGB in the X direction. In this embodiment, the insulating film 47 is provided between the second word line WLB and the third insulator 73 in the X direction. The insulating film 47 extends linearly in the Y direction along the end (the edge) of the second word line WLB in the −X direction. A thickness (for example, a minimum thickness) of the insulating film 47 in the X direction is larger than a thickness (for example, a minimum thickness) of the insulating film 45 in the X direction, or a thickness (for example, a minimum thickness) of the insulating film 46 in the X direction. An example of the insulating film 47 is formed of aluminum oxide ($Al_2O_3$).

<5.4 Insulation Separator>

In the present embodiment, the second insulator 72 includes a plurality of first portions 74 and a second portion 75. Each of the first portions 74 extends linearly in the Y direction. The plurality of first portions 74 are provided separately on both sides of the first floating gate electrode FGA in the Y direction. In other words, the first portion 74 is provided between two of the plurality of first floating gate electrodes FGA arranged in the Y direction. A maximum thickness of the first portion 74 in the X direction is larger than a maximum thickness T4 of the first floating gate electrode FGA in the X direction. In another view point, the first portion 74 includes a portion 74s which is not arranged with respect to the first block insulating film 41A in the X direction. A minimum thickness T2 (or a maximum thickness) of the portion 74s of the first portion 74 in the X direction is larger than a maximum thickness T4 of the first floating gate electrode FGA in the X direction. The first portion 74 is formed of, for example, silicon nitride (SiN).

The second portion 75 is provided between the insulating film 46 of the first block insulating film 41A and the first word line WLA. In this embodiment, the second portion 75 is provided between the insulating film 46 of the first block insulating film 41A and the insulating film 47 of the first block insulating film 41A in the X direction. The second portion 75 extends linearly in the Y direction along the insulating film 47. The second portion 75 and the plurality of first floating gate electrodes FGA are arranged in the X direction. Further, the second portion 75 and the plurality of first portions 74 are arranged in the X direction. The second portion 75 is formed of, for example, silicon oxide ($SiO_2$). A thickness (for example, a minimum thickness) of the second portion 75 in the X direction is larger than a thickness (for example, a minimum thickness) of the insulating film 45 in the X direction, a thickness (for example, a minimum thickness) of the insulating film 46 in the X direction, or a thickness (for example, a minimum thickness) of the insulating film 47 in the X direction.

In the present embodiment, the third insulator 73 includes a plurality of first portions 76 and a second portion 77. Each of the first portions 76 extends linearly in the Y direction. The plurality of first portions 76 are provided separately on both sides of the second floating gate electrode FGB in the Y direction. In other words, the first portion 76 is provided between two of the plurality of second floating gate electrodes FGB arranged in the Y direction. A maximum thickness of the first portion 76 in the X direction is larger than a maximum thickness T5 of the second floating gate electrode FGB in the X direction. In another view point, the first portion 76 includes a portion 76s which is not arranged with respect to the second block insulating film 41B in the X direction. A minimum thickness T3 (or a maximum thickness) of the portion 76s of the first portion 76 in the X direction is larger than a maximum thickness T5 of the second floating gate electrode FGB in the X direction. The first portion 76 is formed of, for example, silicon nitride (SiN).

The second portion 77 is provided between the insulating film 46 of the second block insulating film 41B and the second word line WLB. In this embodiment, the second portion 77 is provided between the insulating film 46 of the second block insulating film 41B and the insulating film 47 of the second block insulating film 41B in the X direction. The second portion 77 extends linearly in the Y direction along the insulating film 47. The second portion 77 and the plurality of second floating gate electrodes FGB are arranged in the X direction. Further, the second portion 77 and the plurality of first portions 76 are arranged in the X direction. The second portion 77 is formed of, for example, silicon oxide ($SiO_2$). A thickness (for example, a minimum thickness) of the second portion 77 in the X direction is larger than a thickness (for example, a minimum thickness) of the insulating film 45 in the X direction, a thickness (for example, a minimum thickness) of the insulating film 46 in the X direction, or a thickness (for example, a minimum thickness) of the insulating film 47 in the X direction.

In one view point, the second portion 75 of the second insulator 72 forms a part of the first block insulating film 41A. In this case, the first block insulating film 41A has layers including, for example, the insulating film 45 ($SiO_2$), the insulating film 46 (SiN), the second portion 75 ($SiO_2$) of the second insulator 72, and the insulating film 47 ($Al_2O_3$). Similarly, the second portion 77 of the third insulator 73 forms a part of the second block insulating film 41B. In this case, the second block insulating film 41B has layers including, for example, the insulating film 45 ($SiO_2$), the insulating film 46 (SiN), the second portion 76 ($SiO_2$) of the third insulator 73, and the insulating film 47 ($Al_2O_3$).

However, the configuration of the block insulating film 41 is not limited to the above example. For example, the block insulating film 41 may include a metal film (for example, a metal film formed of ruthenium (Ru), titanium nitride (TiN), titanium (Ti), tungsten (W), or molybdenum (Mo)), and an insulating film referred to as "IFD" (for example, an insulating film formed of silicon oxide (SiOx), silicon oxynitride (SiON), or silicon nitride (SiN)) provided between the metal film and the floating gate electrode FG. In this case, the order of films forming the floating gate electrode FG and the block insulating film 41 is as follows: floating gate electrode FG, the IFG, the metal film, High-k material (for example, HfSiOx), silicon oxide (SiO2), and aluminum oxide (Al2O3). The High-k material is, for example, a High-k material (zirconium (Zr) instead of hafnium (Hf)) that is closer to silicon nitride (SiN), or an oxide containing hafnium (Hf) (for example, HfOx, HfAlSiOx, HfSiOx).

<5.5 Other Dimensional Relationship>

According to the present embodiment, in the cross-sectional view along the X direction and Y direction, a maximum thickness T82 of the second insulator 72 in the X direction is larger than a length L1 of an interface between the first floating gate electrode FGA and the tunnel insulating film 63 in the Y direction. The maximum thickness T82 of the second insulator 72 in the X direction is a total thicknesses of the first portion 74 and the second portion 75 of the second insulator 72 in the X direction, or example. The interface between the first floating gate electrode FGA and the tunnel insulating film 63 is a contact surface in which the first floating gate electrode FGA is in contact with the tunnel insulating film 63. On the other hand, in the cross-sectional view along the X direction and Y direction, the maximum thickness T82 of the second insulator 72 in the X direction is smaller than a maximum thickness T81 of the first insulator 71 in the X direction.

Similarly, in the cross-sectional view along the X direction and Y direction, a maximum thickness T83 of the third insulator 73 in the X direction is larger than a length L2 of an interface between the second floating gate electrode FGB and the tunnel insulating film 63 in the Y direction. The maximum thickness T83 of the third insulator 73 in the X direction is a total thicknesses of the first portion 76 and the second portion 77 of the third insulator 73 in the X direction, for example. The interface between the second floating gate electrode FGB and the tunnel insulating film 63 is a contact surface which the second floating gate electrode FGB is in contact with the tunnel insulating film 63. On the other hand, in the cross-sectional view along the X direction and Y direction, the maximum thickness T83 of the third insulator 73 in the X direction is smaller than the maximum thickness T81 of the first insulator 71 in the X direction.

<5.6 Manufacturing Method>

A method of manufacturing the semiconductor memory device 1 of the present embodiment is similar to the method of manufacturing in the first embodiment. That is, in the manufacturing method of the present embodiment, processes before the process in FIG. 5E are the same as those in the first embodiment. In the process of FIG. 5F, the memory holes AH are formed in a range that does not overlap the sacrificial films 101. In this embodiment, the process of FIG. 5I is not performed. As a result, a pair of linear floating gate electrodes FG as shown in FIG. 12 and pillars 60 provided therebetween are formed. The second and third insulators 72 and 73 are formed by supplying a material (for example, silicon oxide) to a space that is formed by removing sacrificial films 101 in a process performed after a process of FIG. 5J, for example.

<5.7 Advantage>

With such a configuration, the second and third insulators 72 and 73 are provided, and thus it is possible to improve the electrical characteristics of the semiconductor storage device 1.

Hereinbefore, although some embodiments and modifications have been described, the embodiments are not limited to the above examples. For example, two or more embodiments and modifications described above may be combined with each other and be realized. For example, in the fourth to sixth embodiments, the thickness of the second and third insulators 72 and 73 may be as large as in the second or third embodiment.

According to at least one embodiment described above, it is possible to achieve an improvement in an electrical characteristic of the semiconductor storage device by having the second insulator and the third insulator.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a first interconnection extending in a first direction;
a second interconnection extending in the first direction, the second interconnection being adjacent to the first interconnection in a second direction, the second direction intersecting the first direction;
a first channel part between the first interconnection and the second interconnection, the first channel part extending in a third direction, the third direction intersecting the first direction and the second direction;
a second channel part between the first interconnection and the second interconnection, the second channel part being adjacent to the first channel part in the second direction, the second channel part extending in the third direction;
a first charge storage part between the first interconnection and the first channel part;
a second charge storage part between the second interconnection and the second channel part;
a first insulator including a portion between at least a portion of the first charge storage part and at least a portion of the second charge storage part, the first insulator extending in the first direction;
a second insulator between the first interconnection and the first insulator, the second insulator extending in the first direction at a position arranged with respect to the first charge storage part in the first direction; and
a third insulator between the second interconnection and the first insulator, the third insulator extending in the first direction at a position arranged with respect to the second charge storage part in the first direction.

2. The semiconductor storage device according to claim 1, further comprising:
a fourth insulator located on an opposite side of the first insulator with respect to the first channel part in the first direction, the fourth insulator including a portion between another portion of the first charge storage part and another portion of the second charge storage part, the fourth insulator extending in the first direction,
wherein
the first charge storage part includes a first portion located on a first side with respect to a central portion of the first charge storage part, and a second portion located on a second side opposite to the first side with respect to the central portion in the first direction,
the first portion has a first end adjacent to the first insulator in the second direction,
the second portion has a second end adjacent to the fourth insulator in the second direction, and
a shortest distance between a virtual line which connects the first end and the second end and the second charge storage part is smaller than a shortest distance between the first interconnection and the second interconnection.

3. The semiconductor storage device according to claim 1, wherein
the first charge storage part includes a first portion located on a first side with respect to a central portion of the first charge storage part, and a second portion located on a second side opposite to the first side with respect to the central portion in the first direction,
the first portion has a first end adjacent to the first insulator in the second direction,
the second portion has a second end adjacent to the first insulator in the second direction, and
a shortest distance between a virtual line which connects the first end and the second end and the second charge storage part is smaller than a shortest distance between the first interconnection and the second interconnection.

4. The semiconductor storage device according to claim 1, wherein
the second insulator and the third insulator extend linearly in the first direction.

5. The semiconductor storage device according to claim 1, wherein
the second direction is orthogonal to the first direction, and the second insulator is not present in a region overlapping the first channel part in the second direction, and is provided on both sides of the first charge storage part in the first direction.

6. The semiconductor storage device according to claim 1, wherein
a material contained in the second insulator is different from a material contained in the first insulator.

7. The semiconductor storage device according to claim 1, wherein
a material contained in the second insulator is the same as a material contained in the first insulator.

8. The semiconductor storage device according to claim 1, further comprising:
a first insulating film between the first interconnection and the first charge storage part,
wherein
the second insulator includes a portion which is not arranged with respect to the first insulating film in the second direction, and
a minimum thickness of the portion of the second insulator in the second direction is larger than a minimum thickness of the first insulating film in the second direction.

9. The semiconductor storage device according to claim 1, further comprising:
a first insulating film between the first interconnection and the first charge storage part,
wherein
the second insulator includes a portion which is not arranged with respect to the first insulating film in the second direction, and
a minimum thickness of the portion of the second insulator in the second direction is larger than a minimum thickness of the first channel part in the second direction.

10. The semiconductor storage device according to claim 1, further comprising:
a first insulating film between the first interconnection and the first charge storage part, and
a second insulating film between the first channel part and the first charge storage part,
wherein
the second insulator includes a portion which is not arranged with respect to the first insulating film in the second direction, and
a minimum thickness of the portion of the second insulator in the second direction is larger than a minimum thickness of the second insulating film in the second direction.

11. The semiconductor storage device according to claim 2, wherein
the first charge storage part has a first surface facing to the first channel part and a second surface located on an opposite side of the first surface, and
a maximum thickness of the second insulator in the second direction is smaller than a maximum distance between the virtual line and the second surface.

12. The semiconductor storage device according to claim 1, wherein
the first charge storage part has a first surface facing to the first channel part and a second surface located on an opposite side of the first surface, and
a maximum thickness of the second insulator in the second direction is equal to or larger than a maximum distance between the virtual line and the second surface.

13. The semiconductor storage device according to claim 1, wherein
the first charge storage part includes a curved part which is in an arc shape in which the curved part comes closer to the first insulator as being separated from a central portion of the first charge storage part in the first direction.

14. The semiconductor storage device according to claim 13, wherein
a portion of the second insulator is between the first interconnection and the curved part.

15. The semiconductor storage device according to claim 1, further comprising:
an annular channel between the first interconnection and the second interconnection,
wherein the first channel part and the second channel part are included in the annular channel.

16. The semiconductor storage device according to claim 1, wherein
the second insulator includes a first portion and a second portion, the first portion containing a first material and extending in the first direction, the second portion being between the first portion and the first interconnection, the second portion containing a second material and extending in the first direction, the second material being different from the first material.

17. The semiconductor storage device according to claim 16, wherein
the first charge storage part extends in the first direction, and
a maximum thickness of the first portion in the second direction is larger than a maximum thickness of the first charge storage part in the second direction.

18. A semiconductor storage device comprising:
a first interconnection extending in a first direction;
a second interconnection extending in the first direction, the second interconnection being adjacent to the first interconnection in a second direction, the second direction being orthogonal to the first direction;
a first channel part between the first interconnection and the second interconnection, the first channel part extending in a third direction, the third direction intersecting the first direction and the second direction;
a second channel part between the first interconnection and the second interconnection, the second channel part is adjacent to the first channel part in the second direction, the second channel part extending in the third direction;
a first charge storage part between the first interconnection and the first channel part;
a second charge storage part between the second interconnection and the second channel part;
a first insulator including a portion between at least a portion of the first charge storage part and at least a portion of the second charge storage part, the first insulator extending in the first direction;
a second insulator between the first interconnection and the first insulator, the second insulator being in a region that is not overlapping the first channel part in the second direction, the second insulator extending in the first direction; and
a third insulator between the second interconnection and the first insulator, the third insulator being in a region that is not overlapping the second channel part in the second direction, the third insulator extending in the first direction.

19. The semiconductor storage device according to claim 18, wherein
the second insulator and the third insulator extend linearly in the first direction.

20. The semiconductor storage device according to claim 18, further comprising:
a first insulating film between the first interconnection and the first charge storage part,
wherein
the second insulator includes a portion which is not arranged with respect to the first insulating film in the second direction, and
a minimum thickness of the portion of the second insulator in the second direction is larger than a minimum thickness of the first insulating film in the second direction.

* * * * *